(12) United States Patent
Ljubuncic et al.

(10) Patent No.: US 10,501,179 B2
(45) Date of Patent: *Dec. 10, 2019

(54) TECHNOLOGIES FOR MANAGING DATA CENTER ASSETS USING UNMANNED AERIAL VEHICLES

(71) Applicant: Intel Corporation, Santa Clara, CA (US)

(72) Inventors: Igor Ljubuncic, Yokneam Illit (IL); Raphael Sack, Mitzpe Amuka (IL); Tomer Rider, Naahryia (IL); Shahar Taite, Kfar Saba (IL); Robert L. Vaughn, Portland, OR (US); Vishwa Hassan, Chandler, AZ (US); William L. Giard, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/955,346

(22) Filed: Apr. 17, 2018

(65) Prior Publication Data

US 2018/0370628 A1 Dec. 27, 2018

Related U.S. Application Data

(63) Continuation of application No. 15/056,572, filed on Feb. 29, 2016, now Pat. No. 9,944,390.

(51) Int. Cl.
*B64C 39/02* (2006.01)
*G06K 9/46* (2006.01)
(Continued)

(52) U.S. Cl.
CPC ........ *B64C 39/024* (2013.01); *G06F 17/5004* (2013.01); *G06K 9/0063* (2013.01);
(Continued)

(58) Field of Classification Search
CPC ............ B64C 39/024; B64C 2201/141; B64C 2201/146; B64C 2201/123;
(Continued)

(56) References Cited

U.S. PATENT DOCUMENTS

| 6,727,841 B1 * | 4/2004 | Mitra | G01S 7/418 342/191 |
| 8,909,391 B1 * | 12/2014 | Peeters | G05D 1/0027 701/2 |

(Continued)

*Primary Examiner* — Frederick M Brushaber
(74) *Attorney, Agent, or Firm* — Barnes & Thornburg LLP

(57) ABSTRACT

Technologies for managing assets of a data center include a unmanned aerial vehicle (UAV) communicatively coupled to a remote computing device. The UAV is configured to navigate throughout a data center and capture data center mapping information during the navigation usable to generate a three-dimensional (3D) model of the data center. The UAV is further configured to transmit the captured data center mapping information to a remote computing device. Accordingly, the UAV can receive instructions from a remote computing device that define a type of task to be performed by the UAV in the data center and perform such a task (e.g., a data center map update task, an asset inventory task, a maintenance task, a visual inspection task, etc.) based on the received task instructions. Other embodiments are described and claimed herein.

23 Claims, 12 Drawing Sheets

(51) Int. Cl.
    *G06K 9/20*     (2006.01)
    *G06K 9/18*     (2006.01)
    *G06K 9/00*     (2006.01)
    *G08G 5/00*     (2006.01)
    *G06F 17/50*     (2006.01)
    *H04W 4/02*     (2018.01)
    *H04W 68/00*     (2009.01)
    *H04W 84/12*     (2009.01)

(52) U.S. Cl.
    CPC ........... *G06K 9/00664* (2013.01); *G06K 9/18* (2013.01); *G06K 9/2063* (2013.01); *G06K 9/4604* (2013.01); *G08G 5/0013* (2013.01); *G08G 5/0069* (2013.01); *G08G 5/0086* (2013.01); *H04W 4/023* (2013.01); *H04W 68/005* (2013.01); *B64C 2201/123* (2013.01); *B64C 2201/126* (2013.01); *B64C 2201/141* (2013.01); *B64C 2201/146* (2013.01); *G06F 17/5009* (2013.01); *H04W 84/12* (2013.01)

(58) Field of Classification Search
    CPC ......... B64C 2201/126; G06F 17/5004; H04W 68/005; H04W 4/023; H04W 84/12; G08G 5/0069; G08G 5/003
    See application file for complete search history.

(56) References Cited

U.S. PATENT DOCUMENTS

| | | | | |
|---|---|---|---|---|
| 8,948,935 | B1 * | 2/2015 | Peeters | B64C 39/024 701/3 |
| 8,983,682 | B1 * | 3/2015 | Peeters | B64C 39/024 244/190 |
| 9,208,555 | B1 * | 12/2015 | Steiger | G06F 16/5866 |
| 9,262,929 | B1 * | 2/2016 | Roy | G08G 5/0034 |
| 9,292,629 | B2 * | 3/2016 | Solihin | G06F 17/509 |
| 9,626,874 | B1 * | 4/2017 | Gupta | G08G 5/0069 |
| 9,747,808 | B2 * | 8/2017 | Chambers | B64C 39/024 |
| 9,781,356 | B1 * | 10/2017 | Banta | H04N 5/2628 |
| 10,077,984 | B2 * | 9/2018 | Akselrod | G01C 21/206 |
| 2011/0090337 | A1 * | 4/2011 | Klomp | G01C 11/025 348/144 |
| 2012/0019522 | A1 * | 1/2012 | Lawrence | F41G 3/02 345/419 |
| 2013/0317667 | A1 * | 11/2013 | Kruglick | B64C 39/024 701/2 |
| 2014/0163781 | A1 * | 6/2014 | Vian | A01G 23/00 701/3 |
| 2014/0166816 | A1 * | 6/2014 | Levien | B64C 39/024 244/175 |
| 2014/0222248 | A1 * | 8/2014 | Levien | B64C 39/024 701/2 |
| 2014/0288813 | A1 * | 9/2014 | Levien | G05D 1/12 701/301 |
| 2014/0316616 | A1 * | 10/2014 | Kugelmass | G05D 1/101 701/8 |
| 2015/0160658 | A1 * | 6/2015 | Reedman | G05D 1/102 701/3 |
| 2016/0004920 | A1 * | 1/2016 | Armstrong-Crews | G03B 35/00 348/46 |
| 2017/0048403 | A1 * | 2/2017 | Baba | H04N 1/00127 |
| 2017/0160735 | A1 * | 6/2017 | Mikan | B64C 39/024 |
| 2017/0187993 | A1 * | 6/2017 | Martch | B64C 39/024 |
| 2017/0247108 | A1 * | 8/2017 | Ljubuncic | B64C 39/024 |

* cited by examiner

TECHNOLOGIES FOR MANAGING DATA CENTER ASSETS USING UNMANNED AERIAL VEHICLES

CROSS-REFERENCE TO RELATED APPLICATION

The present application is a continuation of U.S. application Ser. No. 15/056,572, entitled "TECHNOLOGIES FOR MANAGING DATA CENTER ASSETS USING UNMANNED AERIAL VEHICLES," which was filed on Feb. 29, 2016.

BACKGROUND

Unmanned aerial vehicles (UAVs), commonly referred to as drones, refer to aircraft without a human pilot onboard. As such, UAVs may be operated autonomously and/or remotely piloted. As a result, UAVs are continually being used in situations, or environments, in which human life may be endangered. In operation, UAVs have been used by hobbyists, employed by logistics and commercial entities, and deployed in military applications (e.g., reconnaissance, combat, etc.). Advancements in technology have resulted in smaller UAVs, such as quadcopters, capable of navigating indoors using one or more rotors (e.g., vertically oriented propellers). Accordingly, due to their smaller size and weight, such UAVs have increased maneuverability, such that they are capable of being operated indoors.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
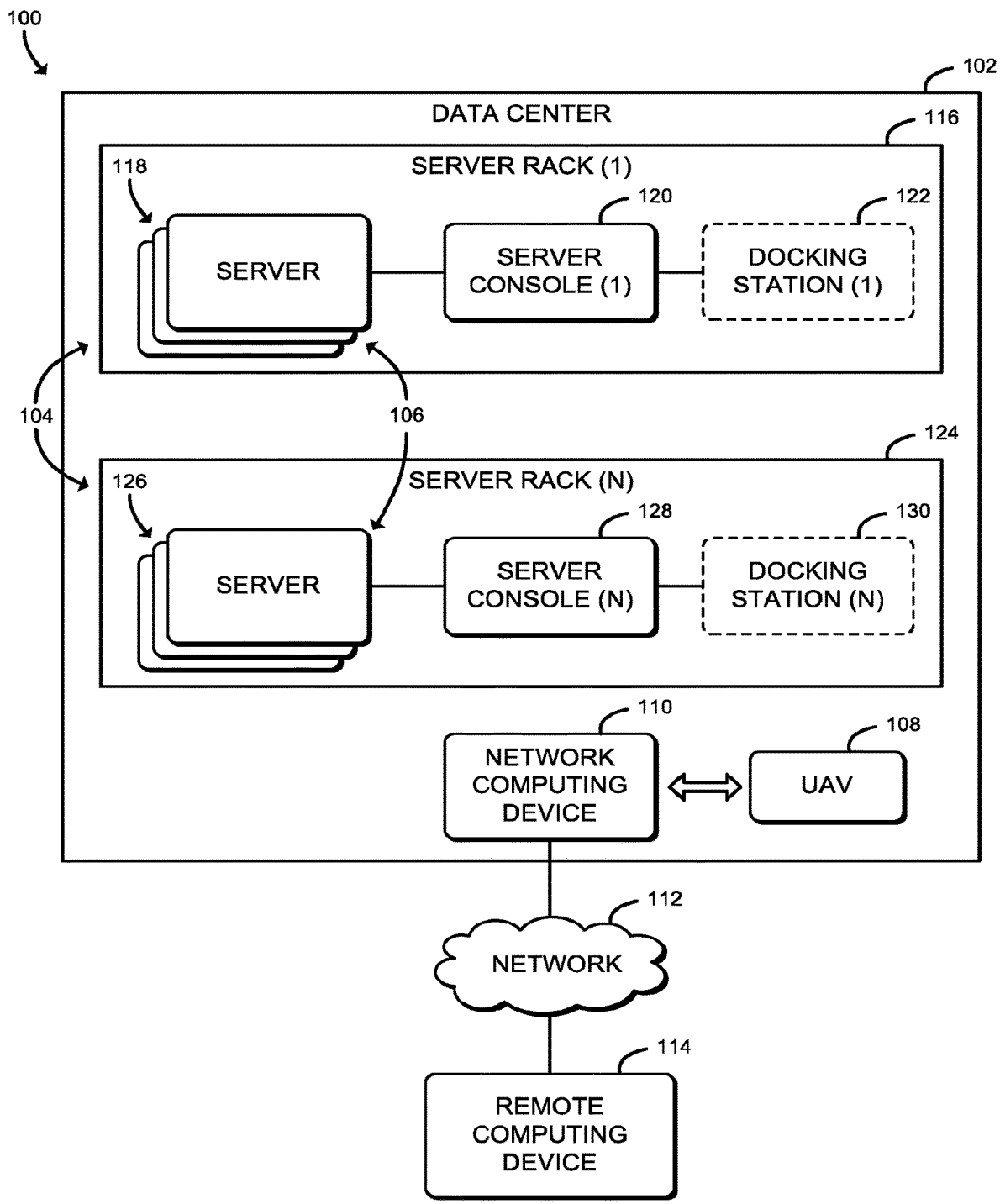
FIG. 1 is a simplified block diagram of at least one embodiment of a system for managing data center assets using unmanned aerial vehicles (UAVs) that includes a UAV in network communication with a remote computing device.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one of A, B, and C" can mean (A); (B); (C): (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media (e.g., memory, data storage, etc.), which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in an illustrative embodiment, a system 100 for managing assets of a data center 102 includes a UAV 108 capable of indoor navigation (i.e., within the data center 102) and multiple servers 106 housed in multiple server racks 104 (e.g., in mounting slots, or bays, of the server racks 104). In use, the UAV 108 performs tasks, described in detail below, within the data center 102. Such tasks may be remotely directed (e.g., via commands received from a remote computing device 114) or triggered locally (e.g., via an event detected by the UAV 108 or a sensor within the data center 102). For example, such tasks may include inventorying assets (e.g., the servers 106, the server racks 104, data cables, power cables, and/or other components/devices of the data center 102), conducting a visual inspection of the assets, performing maintenance on the assets, etc.

Unlike humans (e.g., network administrators, technicians, etc.) performing tasks within the data center 102, the UAV 108 can generally be available to operate at any given time, may be located within the data center 102 at all times, and/or may be able to substantially reduce human error. As a result, response time may be improved, asset inventory data (e.g., a location of the asset, a type of the asset, a status of the asset, etc.) may be more accurate, etc. Additionally, the UAV 108 may be capable of performing in an environment in which a human cannot, or at least cannot without inconvenience. For example, the UAV 108 may be capable of operating in a data center 102 filled with an inert gas (e.g., argon), experiencing a hazardous situation (e.g., fire, flood, earthquake, power outage, etc.), or other conditions that may be hazardous or prohibitive to a human entering or otherwise working in the data center 102. It should be appreciated that, in some embodiments, more than one UAV 108 may be used in a data center 102.

The data center 102 may be embodied as any facility (e.g., room(s), floor(s), building(s), etc.) housing an infrastructure (e.g., virtual and/or physical) for the storage, management, processing, and dissemination of data. As shown, the data center 102 includes multiple server racks 104, with one or more servers 106 housed within each of the server racks 104 (e.g., each of the servers 106 being mounted in one of a multiple number of bays of each of the server racks 104). Typically, the server racks 104 are placed in single rows forming aisles between them, thereby allowing access to the front and rear sides of each server rack 104, as well as allowing for efficient running of data cables and cooling system implementations. It should be appreciated that the data center 102 may include additional components (e.g., redundant power supplies, cooling systems, redundant network connections, security systems, etc.) which are not shown to preserve clarity of the description.

The server racks 104 may be embodied as any type of housing, enclosure, cabinet, etc., capable of housing (e.g., via rails, mounting slots, bays, etc., of the server racks 104) or otherwise enclosing more than one of the servers 106. In some embodiments, the server racks 104 of the data center 102 may be floor-standing, wall-mounted, or a combination thereof. Further, each of the server racks 104 may include one or more doors, cable channels, panels, etc., usable to access the servers 106 stored therein and/or the data cables connected to the servers 106 housed in the server racks 104. The illustrative server racks 104 include a first server rack, designated as server rack (1) 116, and a second server rack, designated as server rack (N) 124 (i.e., the "Nth" server rack of the server racks 104, wherein "N" is a positive integer and designates one or more additional server racks 104).

As shown in FIG. 1, each of the illustrative server racks 104 includes multiple servers 106 (i.e., the servers 118 of the server rack (1) 116 and the servers 126 of the server rack (N) 124). Each of the servers 106 may be embodied as any type of computing device configured to function as a server and capable of performing the functions described herein. In the illustrative system 100, the servers 106 are embodied as rack-mounted servers (i.e., servers designed to be installed in mounting slots of the server racks 104). However, it should be appreciated that, in some embodiments, one or more of the servers 106 may be embodied as a blade server housed in a blade enclosure.

Figure 2:
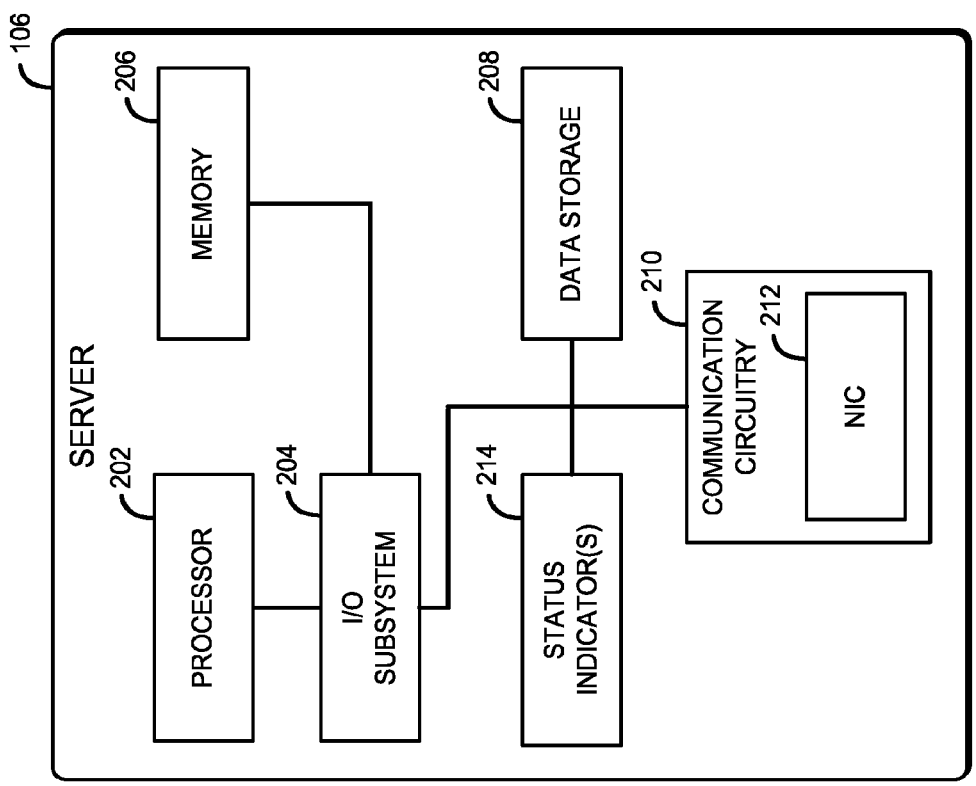
FIG. 2 is a simplified block diagram of at least one embodiment of a server of the system of FIG. 1.

Referring now to FIG. 2, the illustrative server 106 includes a processor 202, an input/output (I/O) subsystem 204, a memory 206, a data storage device 208, communication circuitry 210, and one or more status indicators 214. Of course, in other embodiments, the server 106 may include other or additional components, such as those commonly found in a server (e.g., power supplies, graphics processing units (GPUs), cooling devices, etc.). Additionally, in some embodiments, one or more of the illustrative components may be incorporated in, or otherwise form a portion of, another component. For example, the memory 206, or portions thereof, may be incorporated in the processor 202 in some embodiments. Further, in some embodiments, one or more of the illustrative components may be omitted from the server 106.

The processor 202 may be embodied as any type of processor capable of performing the functions described herein. For example, the processor 202 may be embodied as a single or multi-core processor(s), digital signal processor, microcontroller, or other processor or processing/controlling circuit. Similarly, the memory 206 may be embodied as any type of volatile or non-volatile memory or data storage capable of performing the functions described herein. In operation, the memory 206 may store various data and software used during operation of the server 106, such as operating systems, applications, programs, libraries, and drivers.

The memory 206 is communicatively coupled to the processor 202 via the I/O subsystem 204, which may be embodied as circuitry and/or components to facilitate input/output operations with the processor 202, the memory 206, and other components of the server 106. For example, the I/O subsystem 204 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 204 may form a portion of a system-on-a-chip (SoC) and be incorporated, along with the processor 202, the memory 206, and other components of the server 106, on a single integrated circuit chip.

The data storage device 208 may be embodied as any type of device or devices configured for short-term or long-term storage of data such as, for example, memory devices and circuits, memory cards, hard disk drives, solid-state drives, or other data storage devices. It should be appreciated that the data storage device 208 and/or the memory 206 (e.g., the computer-readable storage media) may store various data as described herein, including operating systems, applications, programs, libraries, drivers, instructions, etc., capable of being executed by a processor (e.g., the processor 202) of the server 106.

The communication circuitry 210 may be embodied as any communication circuit, device, or a collection thereof, capable of enabling communications between the server 106 and other computing devices (e.g., another of the servers 106, a corresponding server console, etc.). The communication circuitry 210 may be configured to use any one or more communication technologies (e.g., wireless or wired communication technologies) and associated protocols (e.g., Ethernet, Bluetooth®, ZigBee®, Wi-Fi®, etc.) to effect such communication. The illustrative communication circuitry 210 includes a network interface controller (NIC) 212. In such embodiments, the NIC 212 may be embodied as one or more add-in-boards, daughtercards, network interface cards, controller chips, chipsets, or other devices that may be used by the server 106. For example, the NIC 212 may be integrated with the processor 202, embodied as an expansion card coupled to the I/O subsystem 204 over an expansion bus (e.g., PCI Express), be a part of a SoC that includes one or more processors, or be included on a multichip package that also contains one or more processors. Additionally or alternatively, in some embodiments, functionality of the NIC 212 may be integrated into one or more components of the server 106 at the board level, socket level, chip level, and/or other levels.

The status indicators 214 may be embodied as any device or devices capable of providing external status feedback (e.g., visual, audio, etc.) of the server 106. For example, in some embodiments, the status indicators 214 may include one or more lights (e.g., light emitting diodes, or LEDs) capable of providing an indication of a present status of the server 106. In such embodiments, the light(s) may be capable of providing a variety of colors, luminance levels, and/or flash patterns to provide the status of the server 106. In some embodiments, additional and/or alternative status indicators 214 may be used, such as audible tones emitted via a speaker of the server 106, status messages (e.g., letters, numbers, symbols, etc.) provided via an on-board display of the server 106, etc.

Referring again to FIG. 1, each of the illustrative server racks 104 includes a server console, or rack console, (i.e., the server console (1) 120 of the server rack 116 and the server console (N) 128 of the server rack 124 (N)). The server consoles 120, 128 may be embodied as any type of computing device configured to provide access to manage operations of the servers 106 within the server racks 104 (i.e., directly at the server racks 104 in which the server consoles 120, 128 are located). It should be appreciated that the server consoles 120, 128 may include various input (e.g., a keyboard, a touchpad, a mouse, a touchscreen, a microphone, etc.) and output (e.g., a monitor, a speaker, lights, etc.) devices which are not shown to preserve clarity of the description.

In some embodiments, the server racks 104 may additionally include a docking station (e.g., the docking station (1) 122 of the server rack 116 and the docking station (N) 130 of the server rack 124 (N)). The docking stations 122, 130 may be embodied as any type of computing device usable by the UAV 108 to land on, charge a batter of the UAV 108, and/or interface with the servers 106 of the server racks 104 (e.g., via the server consoles 120, 128). It should be appreciated that, in some embodiments, the docking stations 122, 130 may be configured to transmit data from the UAV 108 to the network computing device (e.g., the docking stations 122, 130 may be connected to a network computing device 110, described below, via a wired or wireless connection).

Figure 3:
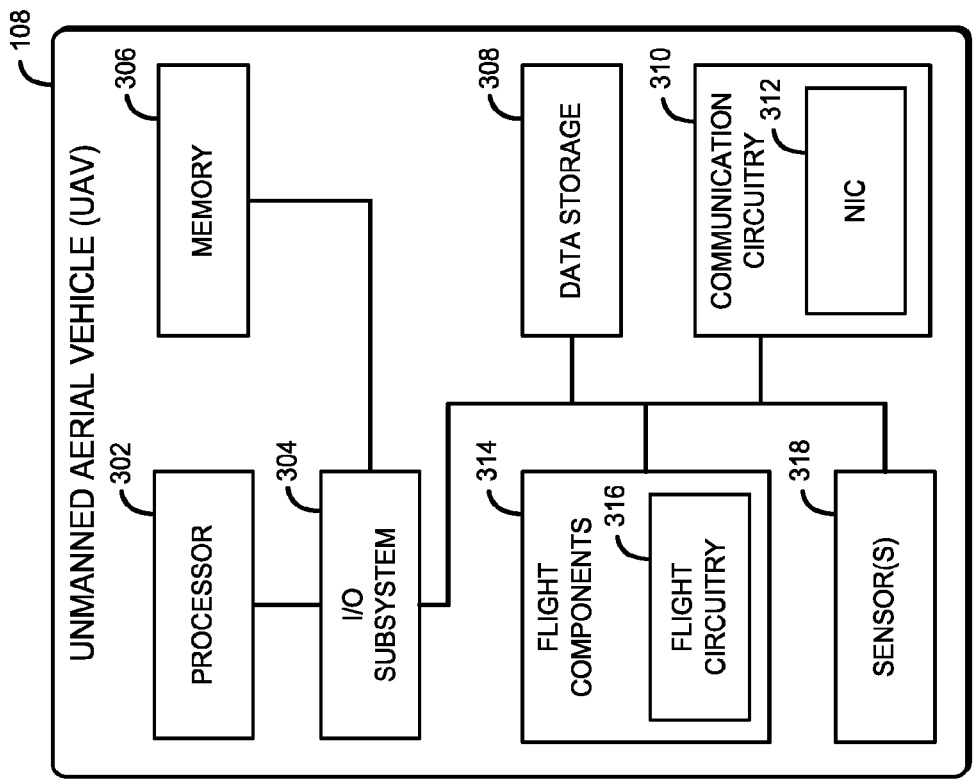
FIG. 3 is a simplified block diagram of at least one embodiment of the UAV of the system of FIG. 1.

The UAV 108 may be embodied as any type of device or devices capable of performing the functions described herein, including any indoor-flight capable aircraft without a human pilot on-board. As such, it should be appreciated that the UAV 108, depending on the embodiment, may be an autonomously piloted aircraft and/or a remotely piloted aircraft. As shown in FIG. 3, the illustrative UAV 108, similar to the illustrative server of FIG. 2, includes a processor 302, an I/O subsystem 304, a memory 306, a data storage device 308, and communication circuitry 310 that includes a NIC 312. As such, further descriptions of the like components are not repeated herein with the understanding that the description of the corresponding components provided above in regard to the illustrative server 106 of FIG. 2 applies equally to the corresponding components of the illustrative UAV 108 of FIG. 3.

The illustrative UAV 108 additionally includes one or more flight components 314 and one or more sensors 318. The one or more flight components 314 may be embodied as any type of device or devices configured to support flight and navigation of the UAV 108 during flight. As such, the flight components 314 may include one or more engines, rotors, electric speed controls (ESCs), power sources, etc., as well as additional and/or alternative flight enabling components. The illustrative flight components 314 includes flight circuitry 316, which may be embodied as any type of hardware, firmware, software, or combination thereof capable of performing the functions described herein. For example, in some embodiments, the flight circuitry 316 may include a flight control board usable to control flight of the UAV 108 using flight software (e.g., embedded firmware and/or software application).

The one or more sensors 318 may be embodied as any sensor, circuitry, and/or other components configured to perform the functions described herein. As such, the sensors 318 may include environment sensors, flight enabling sensors, asset identification sensors, and/or any other type of sensor. In some embodiments, the environment sensors include image sensors, electro-optical sensors, thermal sensors, location sensors, humidity sensors, infra-red sensors, air flow sensors, acoustic sensors, electromagnetic (EM) field sensors, gas sensors, particulate matter sensors, etc. For example, one or more of the image sensors (e.g., an image sensor array) and/or electro-optical sensors may be capable of capturing light and converting the captured light into electrical signals usable to be processed into images from which a 3D model, or map, of the data center 102 can be generated. In some embodiments, the flight enabling sensors may include one or more accelerometers, gyroscopes, and/or magnetometers, such as may be configured to calculate an angular velocity. It should be appreciated that one or more of the flight enabling sensors may be the software-based sensors, such as a software gyroscope sensor, for example. In some embodiments, the asset identification sensors may include a reader (e.g., a radio-frequency identification (RFID) reader, a near field communication (NFC) reader, a barcode scanner, a quick response (QR) code scanner, etc.) configured to read or otherwise receive/collect data associated with a particular asset of the data center 102.

Referring again to FIG. 1, the network computing device 110 may be embodied as one or more computation or computing devices capable of performing the functions described herein, including, without limitation, an access point, a router, a hub, a switch a switch (e.g., rack-mounted, standalone, fully managed, partially managed, full-duplex, and/or half-duplex communication mode enabled, etc.), a network appliance (e.g., physical or virtual), a web appliance, a distributed computing system, a processor-based system, and/or a multiprocessor system. As such, the network computing device 110 may include like components (e.g., processor, I/O subsystem, memory, etc.) to that of the illustrative server 106 of FIG. 2. Accordingly, descriptions of the like components are not repeated herein with the understanding that the description of the corresponding components provided above in regard to the illustrative server 106 of FIG. 2 applies equally to the corresponding components of the network computing device 110. It should be appreciated that the data center 102 may include additional network computing devices, such as routers, switches, network hubs, servers, storage devices, compute devices, etc., as may be necessary to facilitate the flow of network traffic into, through, and out of the data center 102.

The network 112 may be embodied as any type of wired or wireless communication network, including a wireless local area network (WLAN), a wireless personal area network (WPAN), a cellular network (e.g., Global System for Mobile Communications (GSM), Long-Term Evolution (LTE), etc.), a telephony network, a digital subscriber line (DSL) network, a cable network, a local area network (LAN), a wide area network (WAN), a global network (e.g., the Internet), or any combination thereof. It should be appreciated that, in such embodiments, the network 112 may serve as a centralized network and, in some embodiments, may be communicatively coupled to another network (e.g., the Internet). Accordingly, the network 112 may include a variety of other virtual and physical network computing devices (e.g., routers, switches, network hubs, servers, storage devices, compute devices, etc.), as needed to facilitate communication between the network computing device 110 and the remote computing device 114, which are not shown to preserve clarity of the description.

Figure 4:
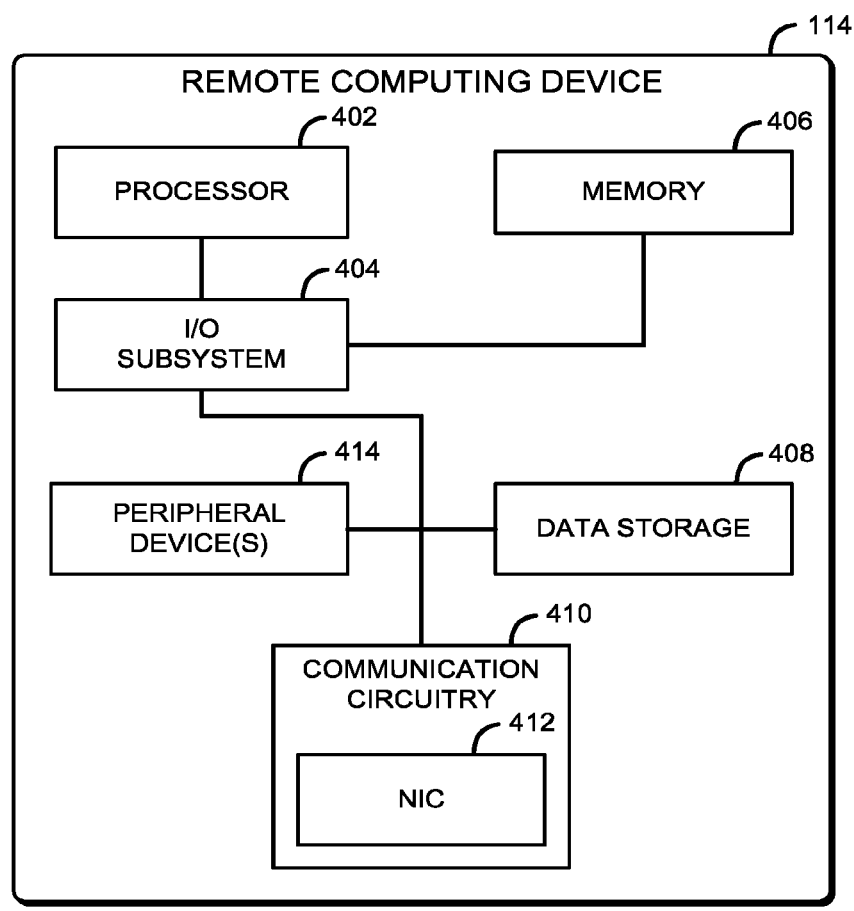
FIG. 4 is a simplified block diagram of at least one embodiment of the remote computing device of the system of FIG. 1.

The remote computing device 114 may be embodied as any type of computation or computer device capable of performing the functions described herein, including, without limitation, a computer, a server (e.g., stand-alone, rack-mounted, blade, etc.), a network appliance (e.g., physical or virtual), a web appliance, a portable computing device (e.g., smartphone, tablet, laptop, notebook, wearable, etc.) that includes mobile hardware (e.g., processor, memory, storage, wireless communication circuitry, etc.) and software (e.g., an operating system) to support a mobile architecture and portability, a distributed computing system, a processor-based system, and/or a multiprocessor system. As shown in FIG. 4, the illustrate remote computing device 114, similar to the illustrative server 106 of FIG. 2, includes a processor 402, an I/O subsystem 404, a memory 406, a data storage device 408, communication circuitry 410 that includes a NIC 412, and one or more peripheral devices 414. As such, further descriptions of the like components are not repeated herein with the understanding that the description of the corresponding components provided above in regard to the illustrative server 106 of FIG. 2 applies equally to the corresponding components of the illustrative remote computing device 114 of FIG. 4.

It should be appreciated that, in some embodiments, the UAV 108 may be configured to directly communicate with a computing device (not shown) capable of receiving updates or notifications from the UAV 108 and/or the remote computing device 114. Such computing devices may be stationary (e.g., a monitor of a server console, a mounted television, a mounted touchscreen display, etc.) and/or portable (e.g., a wearable computing device). In an illustrative example, in which the computing device is an optical head-mounted display (e.g., Google Glass, smart glasses, etc.), the UAV 108 and/or the remote computing device 114 may be configured to provide the generated 3D model with an augmented reality overlay showing the flight path of the UAV 108 to the optical head-mounted display. In another illustrative example, the computing device may be a smart device (e.g., smartphone, smart watch, etc.) capable of receiving notifications that is worn or otherwise carried by an administrator of the data center 102. Accordingly, the administrator may be notified of any asset status changes, anomalies, etc., via the smart device.

Figure 5:
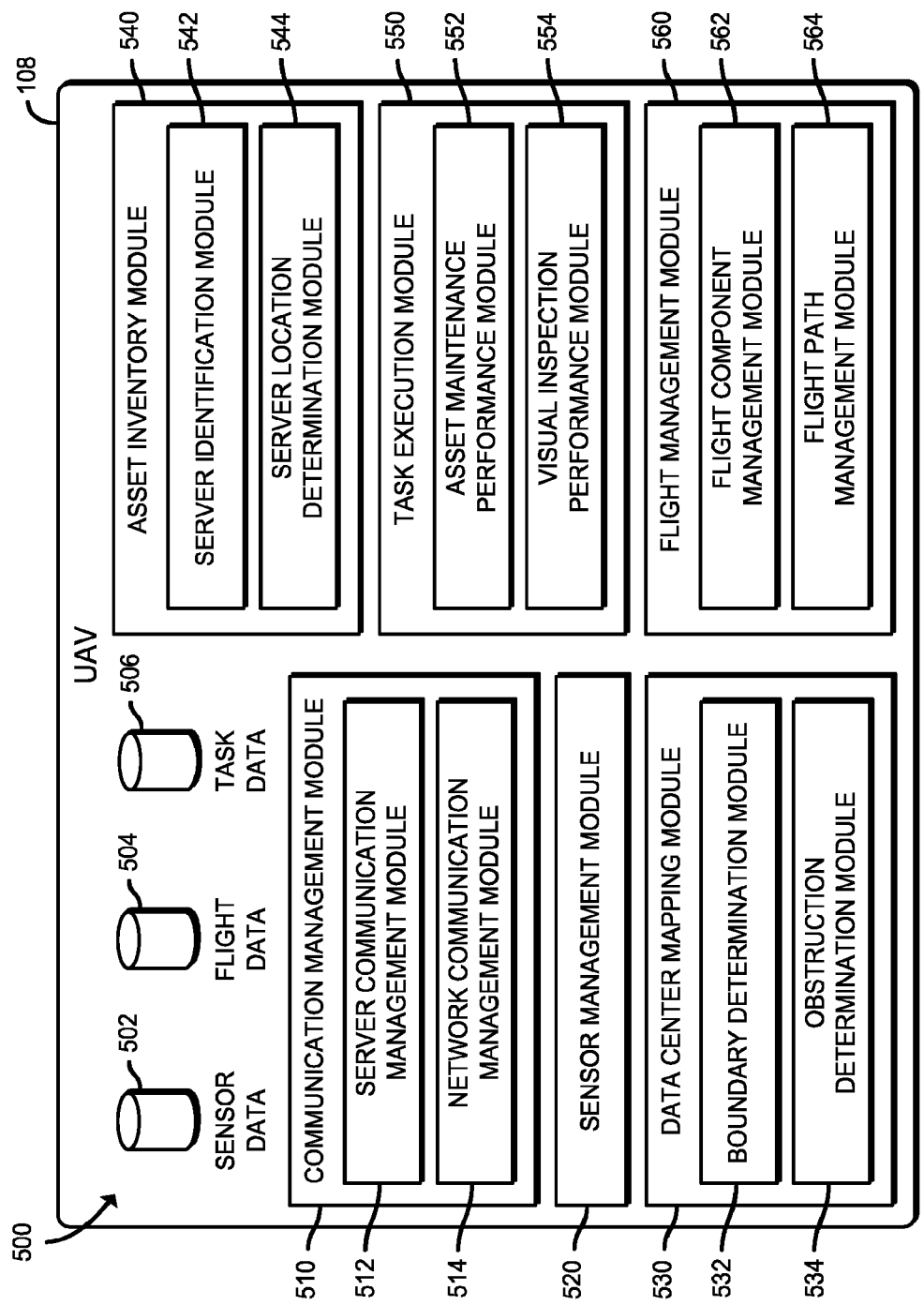
FIG. 5 is a simplified block diagram of at least one embodiment of an environment that may be established by the UAV of FIG. 3.

Referring now to FIG. 5, in an illustrative embodiment, the UAV 108 establishes an environment 500 during operation. The illustrative environment 500 includes a communication management module 510, a sensor management module 520, a data center mapping module 530, an asset inventory module 540, a task execution module 550, and a flight management module 560. It should be appreciated that the UAV 108 may include other components, sub-components, modules, sub-modules, and/or devices commonly found in an indoor-flight capable UAV, which are not illustrated in FIG. 5 for clarity of the description. In the illustrative environment 500, the UAV 108 further includes sensor data 502, flight data 504, and task data 506, each of which may be stored in the memory 306 and/or the data storage device 308 of the UAV 108. Further, each of the sensor data 502, the flight data 504, and/or the task data 506 may be accessed by the various modules and/or sub-modules of the UAV 108.

The various modules of the environment 500 may be embodied as hardware, firmware, software, or a combination thereof. As such, in some embodiments, one or more of the modules of the environment 500 may be embodied as circuitry or a collection of electrical devices (e.g., a communication management circuit 510, a sensor management circuit 520, a data center mapping circuit 530, an asset inventory circuit 540, a task execution circuit 550, and a flight management circuit 560). It should be appreciated that, in such embodiments, one or more of the communication management circuit 510, the sensor management circuit 520, the data center mapping circuit 530, the asset inventory circuit 540, the task execution circuit 550, and the flight management circuit 560 may form a portion of one or more of the processor 302, the I/O subsystem 304, and/or other components of the UAV 108. Additionally, in some embodiments, one or more of the illustrative modules may form a portion of another module and/or one or more of the illustrative modules may be independent of one another. Further, in some embodiments, one or more of the modules of the environment 500 may be embodied as virtualized hardware components or emulated architecture, which may be established and maintained by the processor 302 or other components of the UAV 108.

The communication management module 510, which may be embodied as hardware, firmware, software, virtualized hardware, emulated architecture, and/or a combination thereof as discussed above, is configured to facilitate inbound and outbound wireless network communications (e.g., network traffic, network packets, network flows, etc.) to and from the UAV 108. To do so, the communication management module 510 is configured to receive and process network packets from other computing devices (e.g., the servers 106, the server consoles 120, 128, the docking stations 122, 130, the network computing device 110, and/or another computing device). Additionally, the communication management module 510 is further configured to prepare and transmit network packets to another computing device (e.g., the servers 106, the server consoles 120, 128, the docking stations 122, 130, the network computing device 110, and/or another computing device).

To do so, the illustrative communication management module 510 includes a server communication management module 512 that is configured to communicatively interface with the assets of the data center 102, such as the servers 106, the server consoles 120, 128, the docking stations 122, 130, etc. The illustrative communication management module 510 additionally includes a network communication management module 514 that is configured to communicatively interface with the non-asset computing devices, such as the network computing device 110 and/or another computing device (e.g., a computer, a portable computing device, etc.). It should be appreciated that, in some embodiments, the network communication management module 514 is configured to communicatively interface with one of the docking stations (e.g., one of the docking stations 122, 130 of FIG. 1) and the docking station is configured to act as an intermediary wireless communication device (e.g., for supporting wireless communication between the UAV 108 and the docking station, as well as between the docking station and the network computing device 110 and/or the remote computing device 114), as well as a charging station.

It should be appreciated that each of the server communication management module 512 and the network communication management module 514 of the communication management module 510 may be separately embodied as hardware, firmware, software, virtualized hardware, emulated architecture, and/or a combination thereof. For example, the server communication management module 512 may be embodied as a hardware component, while the network communication management module 514 may be embodied as a virtualized hardware component or as some other combination of hardware, firmware, software, virtualized hardware, emulated architecture, and/or a combination thereof.

The sensor management module 520, which may be embodied as hardware, firmware, software, virtualized hardware, emulated architecture, and/or a combination thereof as discussed above, is configured to manage the sensors (e.g., the sensors 318) of the UAV 108 and the data collected therefrom. In other words, the sensor management module 520 is configured to enable/disable sensors, determine which data is to be collected from the sensors, etc. As described previously, the sensors 318 may include environment sensors (e.g., image sensors, electro-optical sensors, thermal sensors, location sensors, humidity sensors, infra-red sensors, air flow sensors, acoustic sensors, electromagnetic (EM) field sensors, gas sensors, particulate matter sensors, etc.), flight enabling sensors (e.g., accelerometers, gyroscopes, and/or magnetometers), asset identification sensors (e.g., asset tag readers/scanners), and/or any other type of sensor. Additionally, in some embodiments, the sensor management module 520 may be configured to determine one or more measurements (e.g., air flow) based on one or more flight control settings (e.g., a speed of a motor of the UAV 103). In some embodiments, the data collected from the sensors 318 of the UAV 108 may be stored in the sensor data 502.

The data center mapping module 530, which may be embodied as hardware, firmware, software, virtualized hardware, emulated architecture, and/or a combination thereof as discussed above, is configured to map the data center 102. To do so, the illustrative data center mapping module 530 includes a boundary determination module 532 that is configured to determine the boundaries (e.g., floors, ceilings, perimeter walls, interior walls, windows, etc.) of the data center 102 and an obstruction determination module 534 that is configured to determine the obstructions (e.g., assets, stairs, railing, data/power cabling, data cable housings, doorways, etc.) of the data center 102.

It should be appreciated that each of the boundary determination module 532 and the obstruction determination module 534 of the data center mapping module 530 may be separately embodied as hardware, firmware, software, virtualized hardware, emulated architecture, and/or a combination thereof. For example, the boundary determination module 532 may be embodied as a hardware component, while the obstruction determination module 534 may be embodied as a virtualized hardware component or as some other combination of hardware, firmware, software, virtualized hardware, emulated architecture, and/or a combination thereof.

In some embodiments, the boundary determination module 532 and/or the obstruction determination module 534 may be configured to detect the boundaries and/or obstructions based on tags or other identifying marks or beacons located within the data center 102. The boundary determination module 532 and/or the obstruction determination module 534 may be further configured to detect depth of the boundaries and obstructions, such that data collected by the UAV 108 is usable to generate a map, or 3D model, of the data center 102 and the objects detected therein. In some embodiments, the boundary determination module 532 and/or the obstruction determination module 534 may compare the 3D model against a known model (e.g., a design model of the data center 102) to determine (e.g., based on the comparison) the boundaries and/or the obstructions. Accordingly, in such embodiments, the obstruction determination module 534 may be further configured to distinguish which obstructions are assets, such as may be based on known characteristics (e.g., size, color, orientation, and/or other visual identifiable characteristics) of the assets.

The asset inventory module 540, which may be embodied as hardware, firmware, software, virtualized hardware, emulated architecture, and/or a combination thereof as discussed above, is configured to perform, or otherwise manage the performance of, inventorying the assets of the data center 102. In other words, asset inventory module 540 is configured to detect inventory data related to the assets of the data center 102 (i.e., collect asset inventory data). As described previously, the asset inventory data may include a location of the asset, a type of the asset, a status of the asset, etc. The asset inventory module 540 may be configured to collect the asset inventory data based on one or more asset inventory data collection settings. The asset inventory data collection settings define which asset data is to be collected from which sensors of the UAV 108. Accordingly, the asset inventory module 540 may provide the sensor management module 520 with the asset inventory data collection settings, such that the sensor management module 520 can adjust which sensors are collecting data during asset inventory.

It should be appreciated that, in some embodiments, the asset inventory module 540 may be configured to apply adaptive learning algorithms to the inventory process. In such embodiments, the asset inventory module 540 may be configured to adjust the algorithms based on the assets detected and inventoried. For example, in an embodiment wherein the asset inventory module 540 identifies a type of server (e.g., via the server identification module 542 described below) using a complicated or otherwise lengthy process (e.g., comparing an image of the front of the asset to pictures of known types, makes, or models of assets to determine the type of asset being inventoried), the asset inventory module 540 may subsequently start with the last known asset type to determine the type of subsequent similar assets.

To collect the asset inventory data, the illustrative asset inventory module 540 includes a server identification module 542 and a server location determination module 544. It should be appreciated that each of the server identification module 542 and the server location determination module 544 of the asset inventory module 540 may be separately embodied as hardware, firmware, software, virtualized hardware, emulated architecture, and/or a combination thereof. For example, the server identification module 542 may be embodied as a hardware component, while the server location determination module 544 may be embodied as a virtualized hardware component or as some other combination of hardware, firmware, software, virtualized hardware, emulated architecture, and/or a combination thereof.

The server identification module 542 is configured to identify each of the servers 106 in the server racks 104 (e.g., the locations of which may be determined by the data center mapping module). For example, the server identification module 542 may be configured to identify the servers 106 based on a detected configuration, or placement, of controls, ports, lights (e.g., the status indicators 214), etc., on the front of the servers 106 and/or dimensions of the servers 106, such as may be determined from an image of the servers 106 captured by the UAV 108 (e.g., by the sensor management module 520) and compared against known server interfaces and dimensions. Accordingly, the server identification module 542 is configured to distinguish between an empty bay and a server 106, as well as identify a type of the server 106 (e.g., based on the comparison of known server types). The server identification module 542 may be further configured to retrieve an identifier of the server 106 (e.g., a unique serial number of the server), such as may be captured via an image of the server, or a reader/scanner.

The server location determination module 544 is configured to determine a location of each of the identified servers 106 within the server racks 104 relative to the location of the UAV 108, the location of the server rack 104 for which the servers 106 are being determined, and a placement of the server 106 within the server rack 104. For example, the server location determination module 544 may be configured to determine the placement of the server 106 within the server rack 104 (e.g., in which bay of the server rack 104 the server 106 is housed) based on a distance the server 106 is detected from the floor or bottom of the server rack 104 as may be determined by a height of the UAV 108 is from the floor upon detection of the server 106. Accordingly, the server location determination module 544 may be configured to assign a location designation (e.g., X, Y, and Z coordinates) to the server 106, such that location designation may be used to update the map or 3D model of the data center 102 (e.g., as may be performed by the data center mapping module 530).

The task execution module 550, which may be embodied as hardware, firmware, software, virtualized hardware, emulated architecture, and/or a combination thereof as discussed above, is configured to execute various tasks as assigned to the UAV 108. As described previously, such tasks may be directed remotely (e.g., via task request messages received from the remote computing device 114 in response to a detected or scheduled event) or triggered local to the data center 102 (e.g., triggered via an event detected by the UAV 108 or by an asset sensor within the data center 102). It should be appreciated that, in some embodiments, the task execution information (e.g., a type of task to be performed, instruction how to perform the type of task, etc.) and/or task result information (i.e., results of the executed task) may be stored in the task data 506.

In some embodiments, the task execution module 550 may additionally be configured to detect whether a trigger, or event, occurred. In other words, the task execution module 550 may be configured to detect events based on information received directly from one or more assets of the data center 102. To do so, the task execution module 550 may be configured to determine whether a received sensor measurement (e.g., as may be received by the environment sensor management module 620) violates a threshold (e.g., exceeds a maximum threshold value, falls below a minimum threshold value, falls out of a particular value range, etc.) and initiate a responsive action (e.g., initiate a task to be performed by the UAV 108, transmit a notification to an administrator of the data center, initiate a request for a task to be performed by a technician of the data center 102, etc.) if a threshold violation has been detected. For example, a router of the data center 102 may detect a segment of servers going offline and transmit a request to the UAV 108 to perform a visual inspection to inspect the data cables at a back plane of a server rack 104. Other examples of events requiring the UAV 108 to respond include a temperature reading from an asset of the data center 102 needing to be verified in a particular portion of the data center 102, an air cooling unit reporting a faulting fan, a camera having gone offline, a failed attempt by a human to enter the data center 102.

To execute the various tasks assigned to the UAV 108 or in response to events detected by the UAV 108, the illustrative task execution module 550 includes an asset maintenance performance module 552 and a visual inspection performance module 554. It should be appreciated that each of the asset maintenance performance module 552 and the visual inspection performance module 554 of the task execution module 550 may be separately embodied as hardware, firmware, software, virtualized hardware, emulated architecture, and/or a combination thereof. For example, the asset maintenance performance module 552 may be embodied as a hardware component, while the visual inspection performance module 554 may be embodied as a virtualized hardware component or as some other combination of hardware, firmware, software, virtualized hardware, emulated architecture, and/or a combination thereof.

The asset maintenance performance module 552 is configured to manage the performance of asset maintenance. In other words, the asset maintenance performance module 552 is configured to perform maintenance on the asset. For example, the asset maintenance performance module 552 may be configured to perform a diagnostic check on a server 106, install an update on a server 106, and/or other basic maintenance without manual interrupts such as may be encountered by a human operator. To do so, the asset maintenance performance module 552 may be configured to connect to a corresponding server console (e.g., the server console (1) 120 or the server console (N) 128 of FIG. 1), issue one or more commands (e.g., an update, a shutdown, a restart, etc.) to the corresponding server console, and collect results of the operations resulting from the issued commands In another example, the asset maintenance performance module 552 may be configured to connect loose cables, such as may be detected during a visual inspection performed by the visual inspection performance module 554 described below. To do so, the asset maintenance performance module 552 may be configured to control an arm mechanically coupled to the UAV 108 that is configured reconnect a cable (e.g., with a gripping device mechanism to grasp the data/power cable).

The visual inspection performance module 554 is configured to manage the performance of a visual inspection within the data center 102. In other words, the visual inspection performance module 554 is configured to perform visual inspections of the data center 102 and/or one or more assets contained therein. For example, the visual inspection performance module 554 may be configured to perform a visual inspection of the data center 102 to inspect one or more of the servers 106, the server racks 104, an unidentified object within the datacenter, a present condition of the data center 102, etc. To do so, the visual inspection performance module 554 may be configured to capture an image to determine a present state of the asset (e.g., a present LED configuration, a data cable orientation, a temperature level, etc.). In some embodiments, the present state of the asset may be determined locally by the UAV 108 (e.g., by comparing the captured image to an image representative of a possible state of the asset), or transmitted to the remote computing device 114 for further analysis/inspection (e.g., by an operator of the remote computing device 114).

Additionally, the visual inspection performance module 554 may be further configured to manage the capture of other characteristics of the data center 102 or an asset located therein. For example, the visual inspection performance module 554 may be configured to capture readings of one or more measurement devices throughout the data center, such as a temperature reading, a barometric pressure reading, a seismic activity reading, etc. It should be appreciated that the visual inspection performance module 554 may be additionally or alternatively configured to capture additional data during the visual inspection. To do so, the visual inspection performance module 554 may be configured to interface with the sensor management module 520 to collect such data via one or more sensors of the UAV 108, such as may be captured by one or more of the sensors 318 of FIG. 3 described above. In another example, the visual inspection performance module 554 may be configured to detect humans (e.g., administrators, technicians, etc.) in the data center 102 and perform a biometric authentication (e.g., a facial recognition scan) on the humans to determine whether they are authorized to be in the data center 102, or a particular portion of the data center 102.

The flight management module 560, which may be embodied as hardware, firmware, software, virtualized hardware, emulated architecture, and/or a combination thereof as discussed above, is configured to manage the flight operations of the UAV 108. To do so, the flight management module 560 includes a flight component management module 562 and a flight path management module 564. It should be appreciated that each of the flight component management module 562 and the flight path management module 564 of the flight management module 560 may be separately embodied as hardware, firmware, software, virtualized hardware, emulated architecture, and/or a combination thereof. For example, the flight component management module 562 may be embodied as a hardware component, while the flight path management module 564 may be embodied as a virtualized hardware component or as some other combination of hardware, firmware, software, virtualized hardware, emulated architecture, and/or a combination thereof.

The flight component management module 562 is configured to manage the flight components (e.g., the engine(s), rotor(s), ESCs, etc.) during flight (i.e., takeoff, maneuvering, hovering, landing, etc.) of the UAV 108. The flight path management module 564 is configured to manage the flight path of the UAV 108. Accordingly, the flight path management module 564 is configured to receive flight path instruction (e.g., via a pre-programmed flight path saved locally and/or received the remote computing device 114) and interface with (i.e., provide instruction to) flight component management module 562 to command the flight components along to the intended flight path. In some embodiments, the flight path management module 564 may be additionally configured to update the flight path in real time, such as when an obstruction (e.g., a human, a previously unidentified or unknown obstruction, etc.) is detected in the flight path.

Figure 6:
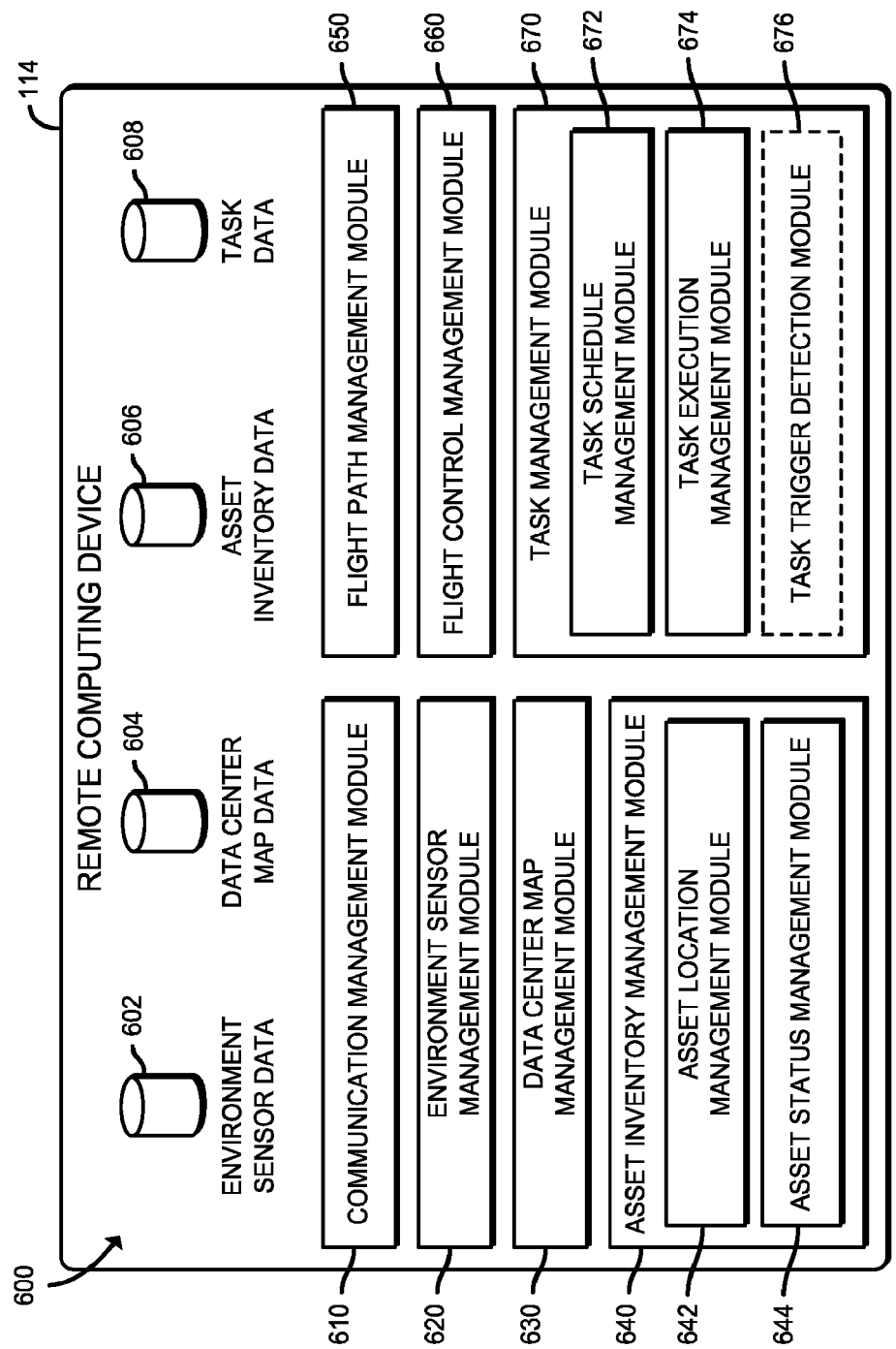
FIG. 6 is a simplified block diagram of at least one embodiment of an environment that may be established by the remote computing device of FIG. 4.

Referring now to FIG. 6, in an illustrative embodiment, the remote computing device 114 establishes an environment 600 during operation. The illustrative environment 600 includes a communication management module 610, an environment sensor management module 620, a data center map management module 630, an asset inventory management module 640, a flight path management module 650, a flight control management module 660, and a task management module 670. It should be appreciated that the remote computing device 114 may include other components, subcomponents, modules, sub-modules, and/or devices commonly found in computing device, which are not illustrated in FIG. 6 for clarity of the description. In the illustrative environment 600, the remote computing device 114 further includes environment sensor data 602, data center map data 604, asset inventory data 606, and task data 608, each of which may be stored in the memory 406 and/or the data storage device 408 of the remote computing device 114. Further, each of the environment sensor data 602, the data center map data 604, the asset inventory data 606, and/or the task data 608 may be accessed by the various modules and/or sub-modules of the remote computing device 114.

The various modules of the environment 600 may be embodied as hardware, firmware, software, or a combination thereof. As such, in some embodiments, one or more of the modules of the environment 600 may be embodied as circuitry or a collection of electrical devices (e.g., a communication management circuit 610, an environment sensor management circuit 620, a data center map management circuit 630, an asset inventory management circuit 640, a flight path management circuit 650, a flight control management circuit 660, and a task management circuit 670). It should be appreciated that, in such embodiments, one or more of the communication management circuit 610, the environment sensor management circuit 620, the data center map management circuit 630, the asset inventory management circuit 640, the flight path management circuit 650, the flight control management circuit 660, and the task management circuit 670 may form a portion of one or more of the processor 402, the I/O subsystem 404, and/or other components of the remote computing device 114. Additionally, in some embodiments, one or more of the illustrative modules may form a portion of another module and/or one or more of the illustrative modules may be independent of one another. Further, in some embodiments, one or more of the modules of the environment 600 may be embodied as virtualized hardware components or emulated architecture, which may be established and maintained by the processor 402 or other components of the remote computing device 114.

The communication management module 610, which may be embodied as hardware, firmware, software, virtualized hardware, emulated architecture, and/or a combination thereof as discussed above, is configured to facilitate inbound and outbound wireless network communications (e.g., network traffic, network packets, network flows, etc.) to and from the remote computing device 114. To do so, the communication management module 610 is configured to receive and process network packets from other computing devices (e.g., the servers 106, the server consoles 120, 128, the docking stations 122, 130, the network computing device 110, and/or another computing device). Additionally, the communication management module 610 is further configured to prepare and transmit network packets to another computing device (e.g., the servers 106, the server consoles 120, 128, the docking stations 122, 130, the network computing device 110, and/or another computing device).

The environment sensor management module 620, which may be embodied as hardware, firmware, software, virtualized hardware, emulated architecture, and/or a combination thereof as discussed above, is configured to manage the sensor of the data center 102. In some embodiments, the data center 102 may include sensors on devices similar to those sensors described above as being local to the UAV 108. Accordingly, the environment sensor management module 620 is configured to receive present sensor measurements (e.g., either from the devices directly via a wired or wireless communication channel, or indirectly from the UAV 108 as described above) and log the measurements.

It should be appreciated that, in some embodiments, the environment sensor management module 620 may be configured to manage which measurements are to be received from the sensors of the UAV 108. In other words, in such embodiments, the environment sensor management module 620 is configured to dictate which of the sensors of the UAV 108 are to be enabled or otherwise collecting data. In some embodiments, the sensor values received by the environment sensor management module 620 may be stored in the environment sensor data 602.

The data center map management module 630, which may be embodied as hardware, firmware, software, virtualized hardware, emulated architecture, and/or a combination thereof as discussed above, is configured to manage the data center map(s), or 3D models, for which the remote computing device 114 is programmed to monitor. For example, the data center map management module 630 may be configured to generate, maintain, and update the data center map(s), as well as maintain a last updated timestamp usable to determine when a data center map is out of date (i.e., is not fresh).

To do so, the data center map management module 630 is configured to initiate a mapping of the data center 102 to be executed by the UAV 108 (see, e.g., blocks 806-812 of FIG. 8 described below). In some embodiments, the data center map management module 630 is configured to initiate a mapping of the data center 102 according to a schedule, such as may be set by a user (e.g., an administrator) of the remote computing device 114. It should be appreciated that the data center map management module 630 may be configured to initiate a mapping of only a portion of the data center 102, such as when a particular portion of the data center 102 has changed, or that particular portion of the map is otherwise out of date (e.g., a particular portion of the data center 102 was unavailable during the most recent mapping of the data center 102). In some embodiments, the data center maps may be stored in the data center map data 604.

The asset inventory management module 640, which may be embodied as hardware, firmware, software, virtualized hardware, emulated architecture, and/or a combination thereof as discussed above, is configured to manage the location and status of the assets of the data center 102 (i.e., asset inventory). As described previously, the assets may include any computing devices (e.g., the servers 106, the server consoles 120, 128, the network computing device 110, other network devices, etc.) or physical components (e.g., the server racks 104, cooling systems, generators, cable housings, etc.) housed in the data center 102.

To initiate asset inventory, the asset inventory management module 640 is configured to transmit an asset inventory request to the UAV 108 that is usable by the UAV 108 to perform the asset inventory. Accordingly, the asset inventory request may include which assets to inventory, a particular portion of the data center 102 in which to perform the asset inventory, any flight path and/or navigation control instructions, etc. The asset inventory management module 640 may be further configured to provide asset tracking and control information to a display of the remote computing device 114, such that a human (e.g., an administrator, a technician, etc.) can take an action (e.g., trigger a task, schedule a task, adjust a cooling condition, adjust a heating condition, replace an asset, physically inspect an asset, etc.) or make a determination (e.g., identify a hot zone, a server dead zone, etc.) based on the asset tracking and control information.

To manage the inventory of the assets of the data center 102, the illustrative asset inventory management module 640 includes an asset location management module 642 and an asset status management module 644. It should be appreciated that each of the asset location management module 642 and the asset status management module 644 of the asset inventory management module 640 may be separately embodied as hardware, firmware, software, virtualized hardware, emulated architecture, and/or a combination thereof. For example, the asset location management module 642 may be embodied as a hardware component, while the asset status management module 644 may be embodied as a virtualized hardware component or as some other combination of hardware, firmware, software, virtualized hardware, emulated architecture, and/or a combination thereof.

The asset location management module 642 is configured to manage the location of the assets in the data center 102. To do so, the asset location management module 642 is configured to manage an asset inventory log (e.g., a table) of assets (i.e., one or more identifiers of the assets) and their present location in the data center 102. The asset status management module 644 is configured to manage the status of the assets in the data center 102. To do so, the asset status management module 644 is configured to manage an asset inventory log (e.g., a table) of assets (i.e., one or more identifiers of the assets) and their present status, or their most recently determined status. In some embodiments, the same asset inventory log, or table, may be used to store the location data and the status data. Additionally, in some embodiments, the location data and/or the status data (e.g., the asset inventory log) may be stored in the asset inventory data 606.

The flight path management module 650, which may be embodied as hardware, firmware, software, virtualized hardware, emulated architecture, and/or a combination thereof as discussed above, is configured to manage one or more flight paths that the UAV 108 may be instructed to navigate. Accordingly, the flight path management module 650 may combine flight path instructions with flight control instructions for navigating the flight path, which may be managed by the flight control management module 660 described below. It should be appreciated that the flight path management module 650 may manage multiple flight paths for particular paths, depending on the type of task, the time of day, etc. In some embodiments, the flight paths may be stored in the data center map data 604 or the task data 608.

The flight control management module 660, which may be embodied as hardware, firmware, software, virtualized hardware, emulated architecture, and/or a combination thereof as discussed above, is configured to manage the flight control information usable by the UAV 108 to control flight component of the UAV 108. To do so, the flight control management module 660 may be configured to determine an optimal set of flight controls based on a particular flight path and/or task. It should be appreciated that, in some embodiments, such flight control determinations may be performed locally by the UAV 108.

The task management module 670, which may be embodied as hardware, firmware, software, virtualized hardware, emulated architecture, and/or a combination thereof as discussed above, is configured to manage various tasks to be performed by the UAV 108, such as maintenance tasks, visual inspection tasks, etc., which may be scheduled or triggered by a present condition (e.g., of an asset, in the data center 102) detected by an asset of the data center 102 and/or the UAV 108. Accordingly, the task management module 670 is configured to receive information related to the present condition (e.g., from the UAV 108 or another asset in the data center 102), analyze the received condition information, and determine whether to initiate a task (e.g., a data center map update task, an asset inventory task, a visual inspection task, a maintenance task, etc.).

The task management module 670 is further configured to transmit a task request message (e.g., a data center map update request, an asset inventory request, a visual inspection request, a maintenance request, etc.) to the UAV 108 upon determining that a task is to be performed by the UAV 108. As such the task request message includes a type of task to be performed, as well as one or more task execution instructions (i.e., directions on what task is to be performed and/or instruction how to perform said task) usable by the UAV 108 to perform the requested task. In some embodiments, the task information may be stored in the task data 608. To manage various tasks to be performed by the UAV 108, the illustrative task management module 670 includes a task schedule management module 672 and a task execution management module 674.

It should be appreciated that each of the task schedule management module 672 and the task execution management module 674 of the task management module 670 may be separately embodied as hardware, firmware, software, virtualized hardware, emulated architecture, and/or a combination thereof. For example, the task schedule management module 672 may be embodied as a hardware component, while the task execution management module 674 may be embodied as a virtualized hardware component or as some other combination of hardware, firmware, software, virtualized hardware, emulated architecture, and/or a combination thereof.

The task schedule management module 672 is configured to manage a schedule of tasks to be performed. To do so, the task schedule management module 672 may be configured to maintain a log of tasks with corresponding dates and times at which certain tasks are to be performed. For example, in some embodiments, a visual inspection of the data center, such as may be initiated to detect humans (e.g., administrators, technicians, etc.) within the data center 102, may be scheduled every day to be initiated at a certain time of the evening in which the data center 102 is typically empty of humans. In another example, in some embodiments, an asset inventory may be scheduled to be performed on a specific day of the week or month.

The task execution management module 674 is configured to manage the execution of the tasks, whether scheduled or triggered. In other words, the task execution management module 674 is configured to provide instruction to the UAV 108 related to the task to be performed, as well as expected data to be collected and returned to the remote computing device 114. To do so, the task execution management module 674 is configured to provide instructions to the UAV 108 that indicates what type of task to be performed (e.g., to determine a location of one or more of the assets, to perform a visual inspection, etc.). The task instructions may include flight path information (e.g., as may be determined by the flight path management module 650 described above) and flight control information (e.g., as may be determined by the flight control management module 660 described above).

In some embodiments, the task management module 670 may additionally include a task trigger detection module 676. In such embodiments, the task trigger detection module 676 may be configured to detect whether a trigger, or event, occurred. To do so, the task trigger detection module 676 may be configured to determine whether a received sensor measurement (e.g., as may be received by the environment sensor management module 620) violates a threshold (e.g., exceeds a maximum threshold value, falls below a minimum threshold value, falls out of a particular value range, etc.) and initiate a responsive action (e.g., initiate a task to be performed by the UAV 108, transmit a notification to an administrator of the data center, initiate a request for a task to be performed by a technician of the data center 102, etc.) if a threshold violation has been detected. In some embodiments, the sensor value thresholds may be stored in the environment sensor data 602. Additionally or alternatively, in some embodiments, the responsive actions triggered by a violated threshold may be stored in the task data 608.

Figure 7:
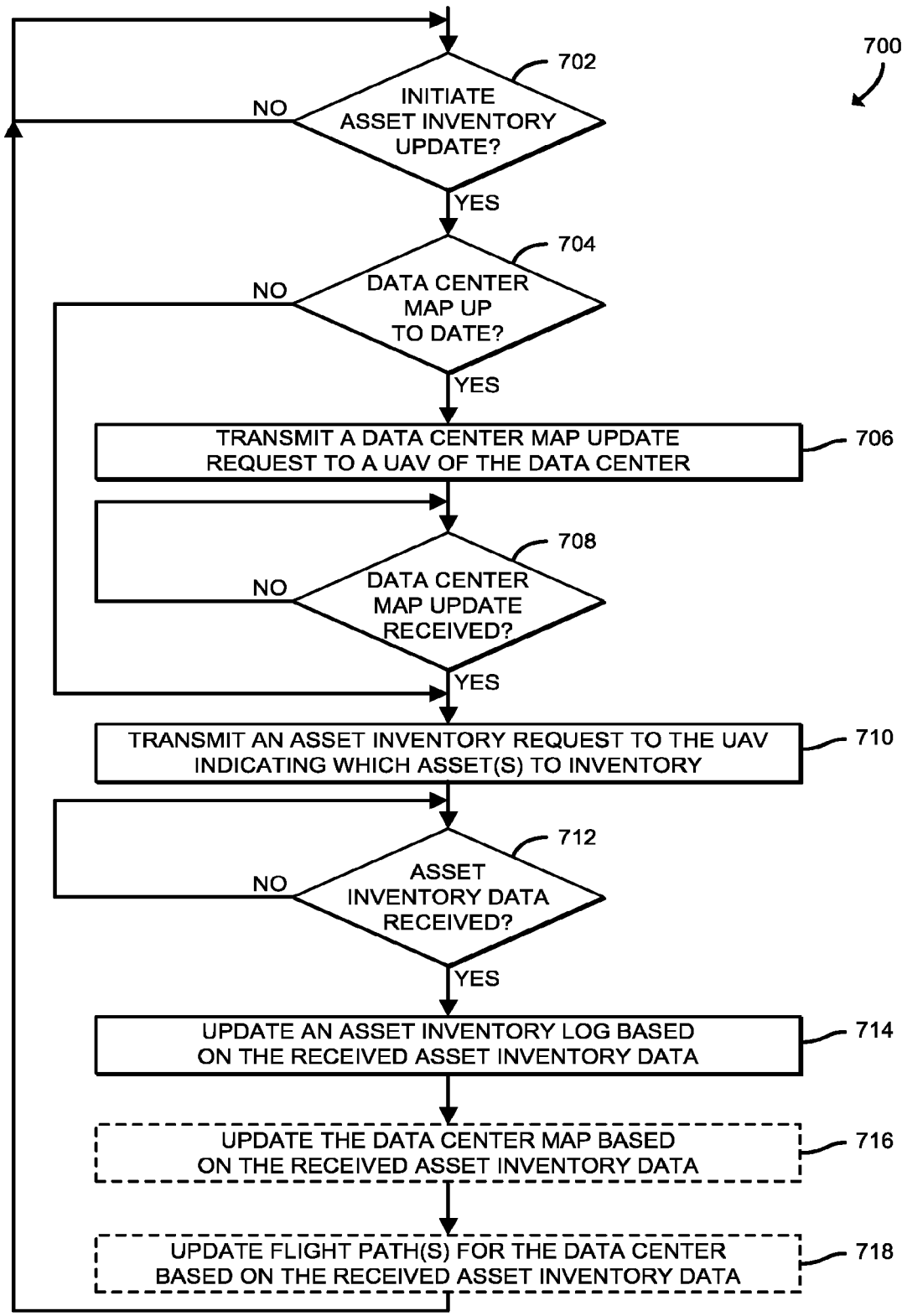
FIG. 7 is a simplified flow diagram of at least one embodiment of a method for initiating an inventory update of the assets of the data center of the system of FIG. 1 that may be executed by the remote computing device of FIGS. 4 and 6.

Referring now to FIG. 7, in use, the remote computing device 114 may execute a method 700 for updating locations of assets of the data center (e.g., the data center 102 of FIG. 1). The method 700 begins in block 702, in which the remote computing device 114 determines whether to initiate an asset inventory update to be performed by the UAV 108 (see, e.g., the method 800 of FIG. 8). As described previously, in some embodiments, tasks to be performed by the UAV 108 may be triggered by an event detected by the remote computing device 114 or a scheduled occurrence of the task stored in a task performance log at the remote computing device 114. For example, the remote computing device 114 may determine that an event was detected and the associated responsive action, or responsive task, corresponds to an asset location update task (i.e., the responsive action is mapped to the detected event that triggered it). Such an event may include an initial asset inventory of the data center 102 (i.e., no previously collected data at initial setup of the UAV 108), a detected configuration change of one or more of the assets of the data center, a previously scheduled asset location update, and/or any other detected event that may require the locations of one or more of the assets to be updated.

In block 704, the remote computing device 114 determines whether a map of the data center 102 is up to date (i.e., current). For example, the remote computing device 114 may determine that a map for the data center 102 has not previously been generated or another condition exists such that the data center map may be out of date. If the map of the data center 102 is determined to be current, the method 700 branches to block 710, which is described below;

otherwise, the method 700 advances to block 706, in which the remote computing device 114 transmits a data center map update request to the UAV 108 indicating to the UAV 108 to perform a task to update the data center map, or 3D model.

The indication may include one or more task instructions to be transmitted to the UAV 108. As described previously, such task instructions may include a type of task to be performed, flight path instructions (e.g., one or more flight path instructions indicating a flight path to be taken), flight control parameters to be used during flight, as well as one or more collection parameters indicating what information is to be collected (i.e., which of the sensors 318 of the UAV 108 are to collect data) during the data center map update task. It should be appreciated that, in some embodiments, certain tasks to be performed by the UAV 108 may be triggered by an event detected by the UAV 108 itself. In such embodiments, the task instructions for the triggered task may be locally stored on the UAV 108, rather than being transmitted by the remote computing device 114 as described in blocks 704. Additionally, in such embodiments, the remote computing device 114 may perform the analysis to determine whether a particular task was triggered and simply transmit an indication of which task was triggered, rather than the additional task instructions as described in block 706.

In block 708, the remote computing device 114 determines whether the data center map update was received from the UAV 108. If so, the method 700 advances to block 710, in which the remote computing device 114 transmits an asset inventory request to the UAV 108 indicating to the UAV 108 to perform an asset inventory task. To do so, in some embodiments, the remote computing device 114 may transmit one or more asset inventory task parameters to the UAV 108 with the asset inventory task request indicating which asset locations are to be updated. For example, the remote computing device 114 may transmit an indication to the UAV 108 to detect asset inventory data (e.g., location, type, status, etc.) based on one or more asset inventory data collection settings (e.g., what asset inventory data to collect) included in the indication. The indication may further include information usable to by the UAV 108 to collect asset inventory data for a particular asset, detect the asset inventory data for each asset in the data center 102, detect the asset inventory data for a set of assets in a particular portion of the data center 102, etc. In block 712, the remote computing device 114 determines whether the asset inventory data request in block 710 has been received.

If so, the method 700 advances to block 714, in which the remote computing device 114 updates an asset inventory log based on the asset inventory data received in block 712. In some embodiments, in block 716, the remote computing device 114 may additionally update the data center map (e.g., a location indicator embedded in the data center map) to indicate the determined locations of the assets for which the asset location data was received in block 712. Additionally or alternatively, in some embodiments, in block 718, the remote computing device 114 may update one or more flight paths for the UAV 108 to navigate through the data center 102 based on the asset location data that was received in block 712.

Figure 8:
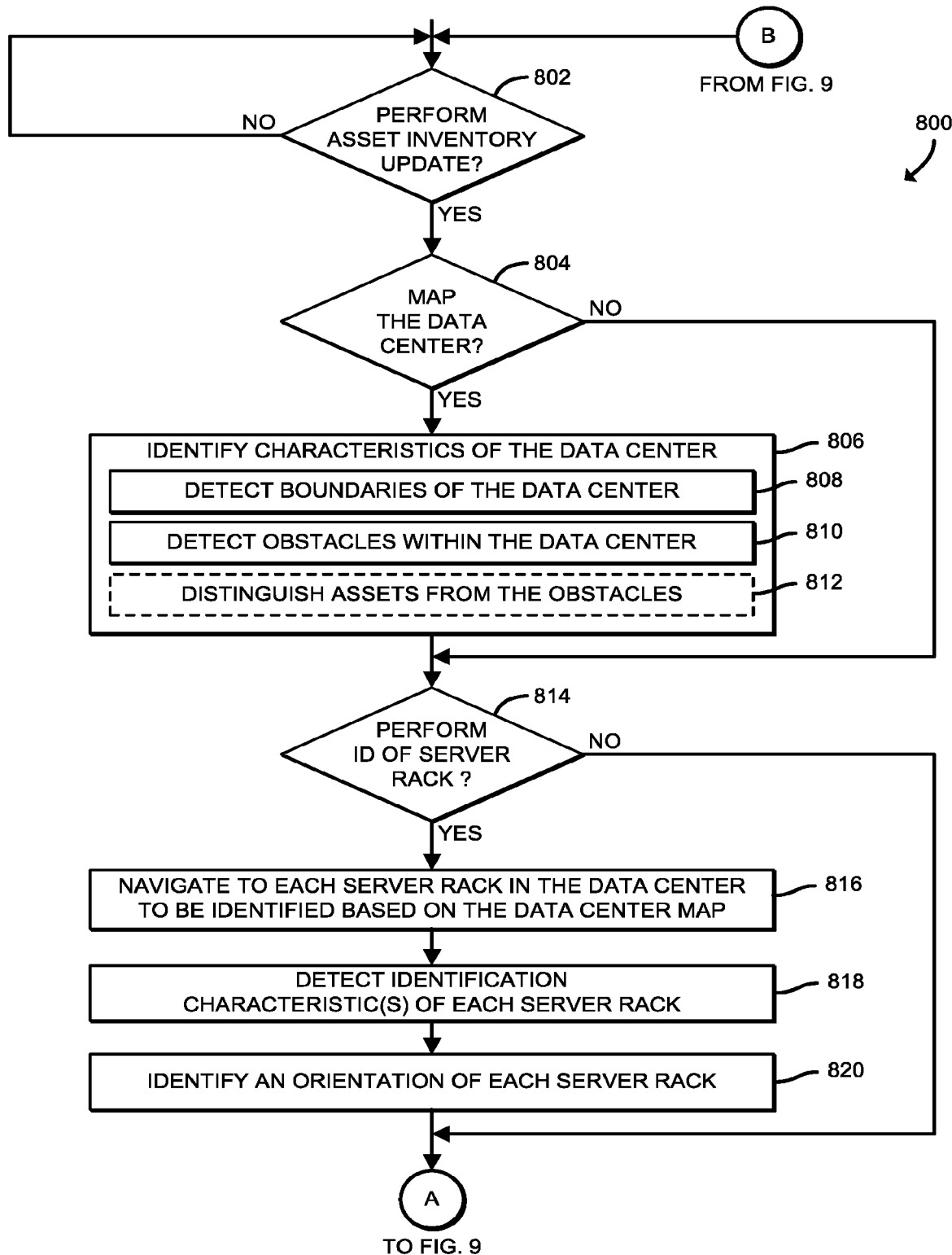
FIGS. 8 and 9 are a simplified flow diagram of at least one embodiment of a method for performing an inventory update of assets of the data center of the system of FIG. 1 that may be executed by the UAV of FIGS. 3 and 5.

Referring now to FIG. 8, in use, the UAV 108 may execute a method 800 for updating locations of assets of the data center (e.g., the data center 102 of FIG. 1). The method 800 begins in block 802, in which the UAV 108 determines whether to perform an asset inventory update (i.e., update location information of one or more assets of the data center 102). As described previously, the assets may include any computing devices (e.g., the servers 106, the server consoles 120, 128, the network computing device 110, other network devices, etc.) or physical components (e.g., the server racks 104, cooling systems, generators, cable housings, etc.) housed in the data center 102. As also described previously, tasks performed by the UAV 108 may be triggered remotely (e.g., based on an indication associated with a task received from the remote computing device 114) or locally (e.g., based on a present condition detected corresponding to an event associated with a responsive action, or responsive task). Accordingly, the UAV 108 may determine whether to update the asset location data based on a remotely activated trigger (i.e., an event triggered by the remote computing device 114 based on data collected by the UAV 108 or from another computing device within the data center 102), or a trigger stored local to the UAV 108.

In block 804, the UAV 108 determines whether the asset location update corresponds to a task that indicated the UAV 108 is to map at least a portion of the data center 102. If not, the method 800 branches to block 814, described below; otherwise, the method 800 advances to block 806, in which the UAV 108 identifies characteristics of the data center, such as may be identified by capturing images, reflected light data, etc. To do so, in block 808 the UAV 108 detects the boundaries (e.g., exterior walls, floors, ceilings, closed doors, etc.) of the data center 102. Additionally, in block 810, the UAV 108 detects any obstacles (e.g., interior walls, stairs, data/power cable housing, other components/devices, etc.) within the data center 102. In some embodiments, the UAV 108 may compare the obstacles against a known model (e.g., a design model of the data center 102) to determine (e.g., based on the comparison) the boundaries and/or the obstructions.

In some embodiments, in block 812, the UAV 108 may be configured to distinguish assets of the data center 102 from the detected obstructions. In such embodiments, the UAV 108 may be configured to distinguish which obstructions are assets, such as may be based on known characteristics (e.g., size, color, orientation, and/or other visual identifiable characteristics) of the assets. For example, in such embodiments, the UAV 108 may identify the location of server racks 104 of the data center based on characteristics of the server racks 104, as distinguished from the other obstacles detected in block 810. It should be appreciated that, in some embodiments, identification of the detected obstacles (i.e., whether one or more of the detected obstacles are assets or other distinguishable components/devices of the data center 102) may be performed by the remote computing device 114. In such embodiments, the remote computing device 114 may perform the identification based on the data center characteristics identified in block 806 and subsequently transmitted to the remote computing device 114 for analysis.

In block 814, the UAV 108 determines whether to perform an identification of the server racks 104 of the data center 102. If not, the method 800 branches to block 822 of FIG. 5, which is described below; otherwise, the method 800 advances to block 816. In block 816, the UAV 108 navigates to a location of each server rack 104 in the data center 102 to be identified. To do so, the UAV 108 may rely on a previously determined location (e.g., as may be instructed in a predetermined flight path), or the UAV 108 may perform a visual search to locate each of the server racks 104 to be identified. In block 818, to identify the location of the server racks 104, the UAV 108 detects one or more identification characteristics of each of the server racks 104 to be identified.

The identification characteristics may include any characteristics usable to determine a type (e.g., make, model, manufacturer, etc.) of the server rack 104. Such identification characteristics may include a serial number or other identifiable characteristic, such as whether the server rack 104 is wall-mounted or floor-standing, a number of available bays detected in the server rack 104, the way in which the servers 106 are mounted in the server rack 104, a type of server (e.g., rack-mounted servers or blade servers) housed in the server rack 104, etc. In block 820, the UAV 108 identifies an orientation of each of the server racks 104. In other words, the UAV 108 determines which direction the front and/or rear of the server racks 104 is facing relative to the data center 102 and/or the other server racks 104.

Figure 9:
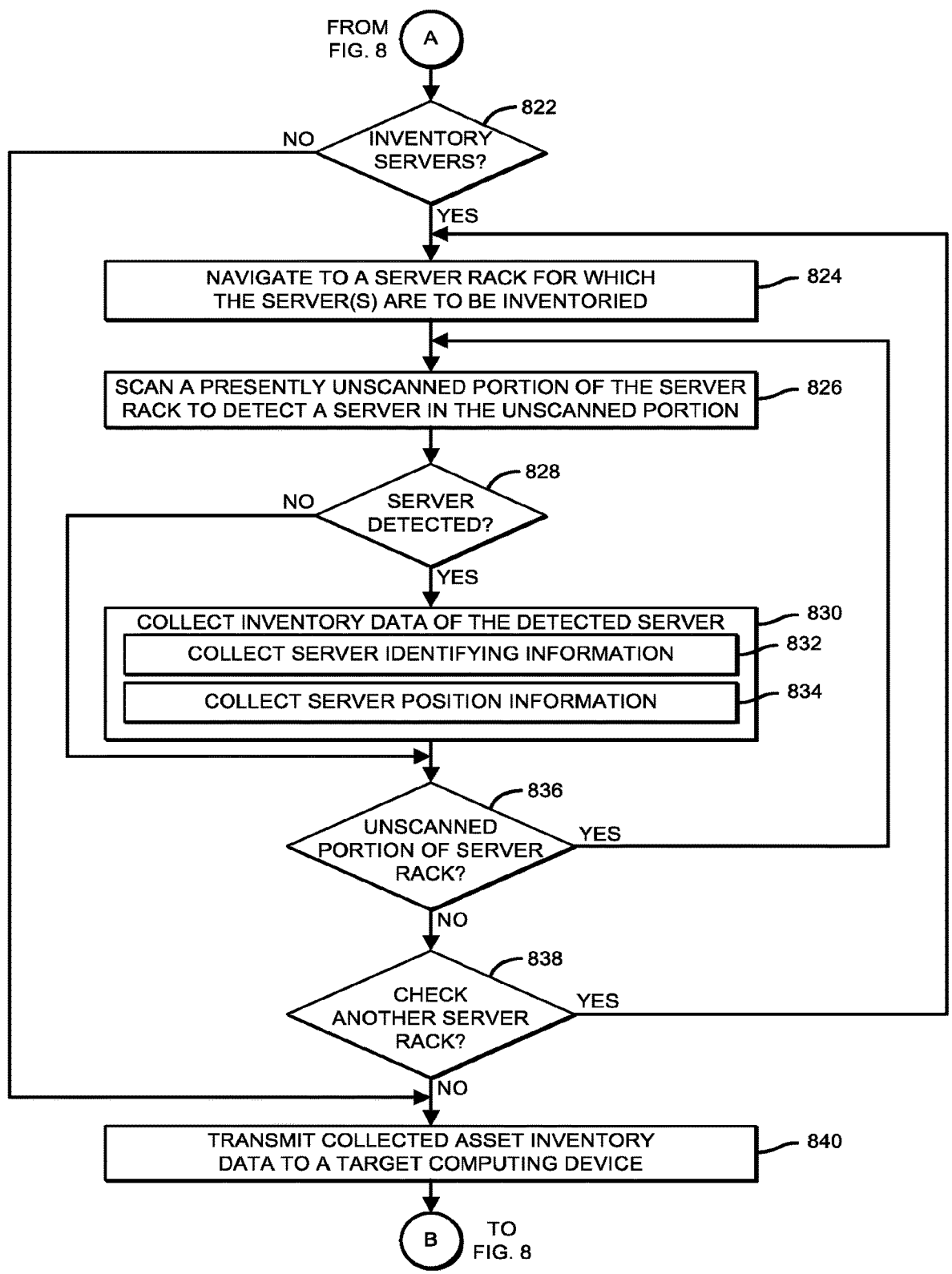

In block 822 of FIG. 9, the UAV 108 determines whether to inventory the servers 106 in one or more server racks 104. If not, the method 800 branches to block 840, which is described below; otherwise, the method 800 advances to block 824, in which the UAV 108 navigates (e.g., based on a predetermined flight path) to one of the server racks 104 for which the servers 106 are to be inventoried. In block 826, the UAV 108 scans a presently unscanned portion of the server rack 104 navigated to in block 824 to determine whether a server 106, or an empty bay, is detected in the unscanned portion. In some embodiments, scanning the unscanned portion of the server rack 104 may include capturing an image of the portion of the server rack 104 being inventoried.

In block 828, the UAV 108 determines whether a server was detected (i.e., as a result of the scan performed in block 826). If not, the method 800 branches to block 836, which is described below; otherwise, the method 800 advances to block 830 in which the UAV 108 collects information of the server 106 detected by the scan in block 826. For example, in block 832, the UAV 108 collects server identifying information. In some embodiments, the server identifying information may be collected by the UAV 108 via an image taken of the server 106 that is usable to identify the server 106, such as may be identified based on an identifiable configuration or placement, of controls, ports, lights (e.g., the status indicators 214), etc., on the front of the server 106. Additionally or alternatively, in some embodiments, the server identifying information may be collected by reading, or otherwise scanning, an RFID tag, an NFC tag, a barcode, a QR code, etc., of a detected server 106. In block 834, the UAV 108 collects position information of the server 106. The position information may include a height at which the server 106 is detected in the server rack 104, which may be usable to determine which bay of the server rack 104 the server is presently housed. In some embodiments, the UAV 108 may determine the height based on a present height of the UAV 108 from the floor (i.e., a detected elevation of the UAV 108 from the floor upon detection of the server 106).

In block 836, the UAV 108 determines whether there is an unscanned portion of the server rack 104. In other words, the UAV 108 determines whether additional bays of the server rack 104 are available to scan to determine whether they include additional servers 106 to be inventoried. If so, the method 800 returns to block 826, in which the UAV 108 scans a presently unscanned portion of the server rack 104 to detect another server 106. Otherwise, if there is not an unscanned portion of the server rack 104 (i.e., all available server 106 allocable spaces of the server rack 104 have been scanned), the method 800 advances to block 838.

In block 838, the UAV 108 determines whether to check another server rack 104. In other words, the UAV 108 determines whether additional server racks 104 have not been scanned that may be application to the server 106 inventory initiated in block 822. If so, the method returns to block 824, in which the UAV 108 navigates to another server rack 104 to inventory the servers 106 housed therein; otherwise, the method 800 advances to block 840. In block 840, the UAV 108 transmits the collected asset inventory data to a target computing device (e.g., the remote computing device 114) before the method 800 returns to block 802 to determine whether another asset inventory update has been requested.

Figure 10:
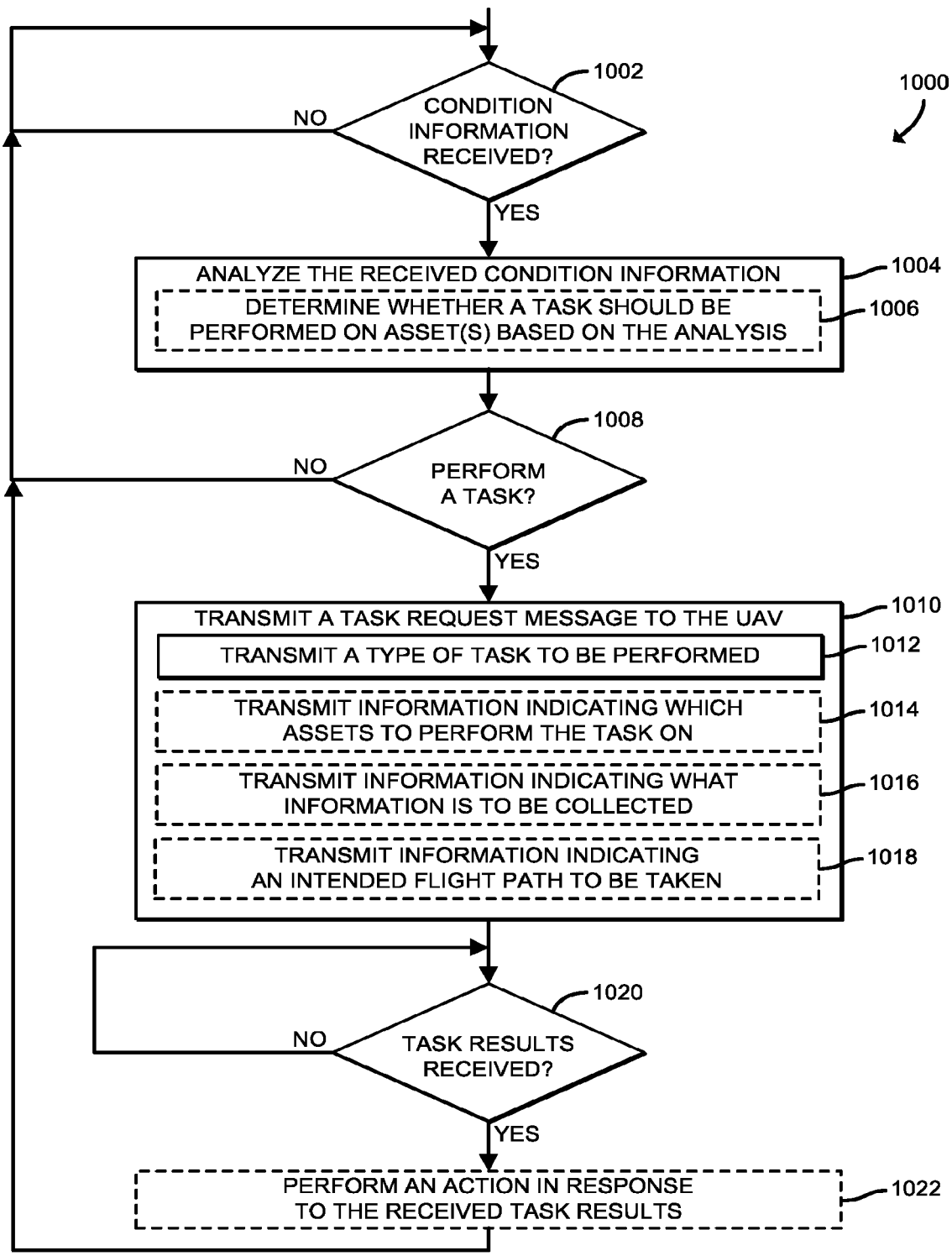
FIG. 10 is a simplified flow diagram of at least one embodiment of a method for initiating a task to be performed by the UAV of FIGS. 3 and 5 that may be executed by the remote computing device of FIGS. 4 and 6.

Referring now to FIG. 10, in use, the remote computing device 114 may execute a method 1000 for updating locations of assets of the data center (e.g., the data center 102 of FIG. 1). The method 1000 begins in block 1002, in which the remote computing device 114 determines whether condition information has been received (e.g., from the UAV 108 or another asset in the data center 102) related to a present condition of an asset in the data center 102, a condition of the environment of the data center 102, etc. If so, the method 1000 advances to block 1004, in which the remote computing device 114 analyzes the received condition information.

In block 1006, the remote computing device 114 analyzes the received condition information to determine whether a task should be performed on one or more assets of the data center 102. For example, the remote computing device 114 may analyze the received condition information to determine whether a received sensor measurement violates a predetermined threshold (e.g., exceeds a maximum threshold value, falls below a minimum threshold value, falls out of a particular value range, etc.) and initiate a responsive action (e.g., initiate a task to be performed by the UAV 108, transmit a notification to an administrator of the data center, initiate a request for a task to be performed by a technician of the data center 102, etc.) if a threshold violation has been detected. In block 1008, the remote computing device 114 determines whether to perform a task (e.g., a data center map update task, an asset inventory task, a maintenance task, an additional visual inspection task, etc.).

If not, the method 1000 returns to block 1002 to determine whether additional condition information has been received; otherwise, the method 1000 advances to block 1010, in which the remote computing device 114 transmits a task request message to the UAV 108. It should be appreciated that the task request message may include task related data. For example, in block 1012, the remote computing device 114 transmits the task request message including a type of task to be performed. In another example, in block 1014, the remote computing device 114 may transmit the task request message including information indicating which assets to perform the task on. In still another example, in block 1016, the remote computing device 114 may transmit the task request message including information indicating what information is to be collected during performance of the task. In yet another example, in block 1018, the remote computing device 114 may transmit the task request message including information indicating an intended flight path to be taken or flight navigation control instructions to be used during the task.

For example, the remote computing device 114 may transmit a task request message that indicates to the UAV 108 to perform a visual inspection of the data center 102 and/or one or more objects (e.g., assets, boundaries, other components, etc.) of the data center 102. In such an embodiment, the task request message (i.e., a visual inspection task request) may include one or more visual inspection task instructions, which may include any type of instructions usable to perform the visual inspection task, such as which objects are to be visually inspected, a degree of visual inspection to be performed, locations of the objects to be visually inspected, etc. Additionally, in some embodiments, the task request message may include additional visual inspection task instructions, such as an intended flight path to be taken by the UAV 108 during the visual inspection (e.g., a flight path to the object to be visually inspected, a flight path to navigate through at least a portion of the data center 102 to be visually inspected, etc.) and/or what information (e.g., of the object, of the environment of the data center 102, etc.) is to be collected by the UAV 108 during the visual inspection.

In block 1020, the remote computing device 114 determines whether task results (e.g., success, failure, return code, error code, etc.) were received from the UAV 108 subsequent to the UAV 108 having performed, or having attempted to perform, the assigned task. If so, the method 1000 advances to block 1022, in which the remote computing device 114 may take a subsequent action based on the received task results. For example, the remote computing device 114 may update an asset inventory log, notify an administrator (e.g., via text message, email, etc.), adjust a setting of an asset in the data center 102, etc. From block 1022, the method 1000 returns to block 1002, in which the remote computing device 114 determines whether additional condition information has been received.

Figure 11:
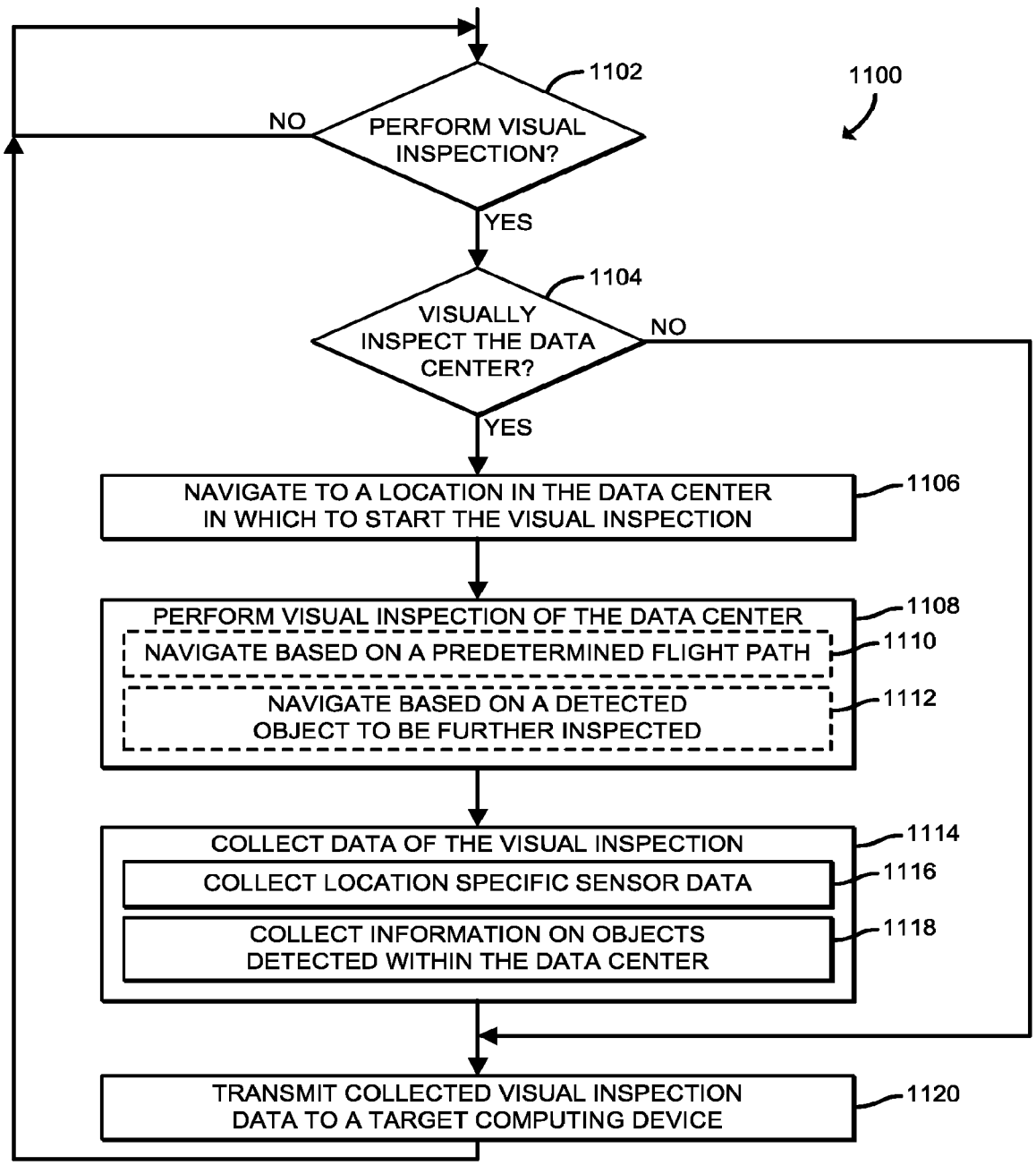
FIG. 11 is a simplified flow diagram of at least one embodiment of a method for performing a visual inspection of the data center of the system of FIG. 1 that may be executed by the UAV of FIGS. 3 and 5.

Referring now to FIG. 11, in use, the UAV 108 may execute a method 1100 for performing a visual inspection of the data center (e.g., the data center 102 of FIG. 1) and/or the assets contained therein. The method 1100 begins in block 1102, in which the UAV 108 determines whether to perform a visual inspection of the data center 102. As described previously, in some embodiments, the visual inspection may be initiated, or triggered, by an event detected by the UAV 108 or the remote computing device 114. In such embodiments wherein the remote computing device 114 triggers the visual inspection, the remote computing device 114 may provide the UAV 108 with visual inspection task parameters, or instructions, as described above. If the UAV 108 determines to perform the visual inspection, the method 1100 advances to block 1104, in which the UAV 108 determines whether to visually inspect the data center 102. If not, the method 1100 branches to block 1120, which is described below; otherwise, the method 1100 advances to block 1106.

In block 1106, the UAV 108 navigates to a location in the data center 102 in which to start the visual inspection. In block 1108, the UAV 108 performs a visual inspection of the data center 102. In some embodiments, in block 1110, the UAV 108 may navigate the data center 102 based on a predetermined flight path. It should be appreciated that the UAV 108 may navigate around or otherwise identify obstructions in the predetermined flight path such that the flight path can be successfully adjusted (i.e., the obstruction circumvented). Additionally, in some embodiments, in block 1112, the UAV 108 may navigate based on a detected object (e.g., an unauthorized person, an obstruction, a component or asset of the data center 102, etc.) that may require further inspection.

In block 1114, the UAV 108 collects data gathered during the visual inspection. For example, in block 1116, the UAV 108 collects location-specific sensor data (i.e., sensor data relative to a location within the data center 102), such as a sensor reading in a particular area of the data center 102. In another example, in block 1118, the UAV 108 collects information on objects (e.g., assets, obstructions, etc.) detected within the data center 102, such as a present configuration of the object, a present status of an asset, etc.

In block 1120, the UAV 108 transmits the visual inspection data collected in block 1114 to a target computing device (e.g., the remote computing device 114).

Figure 12:
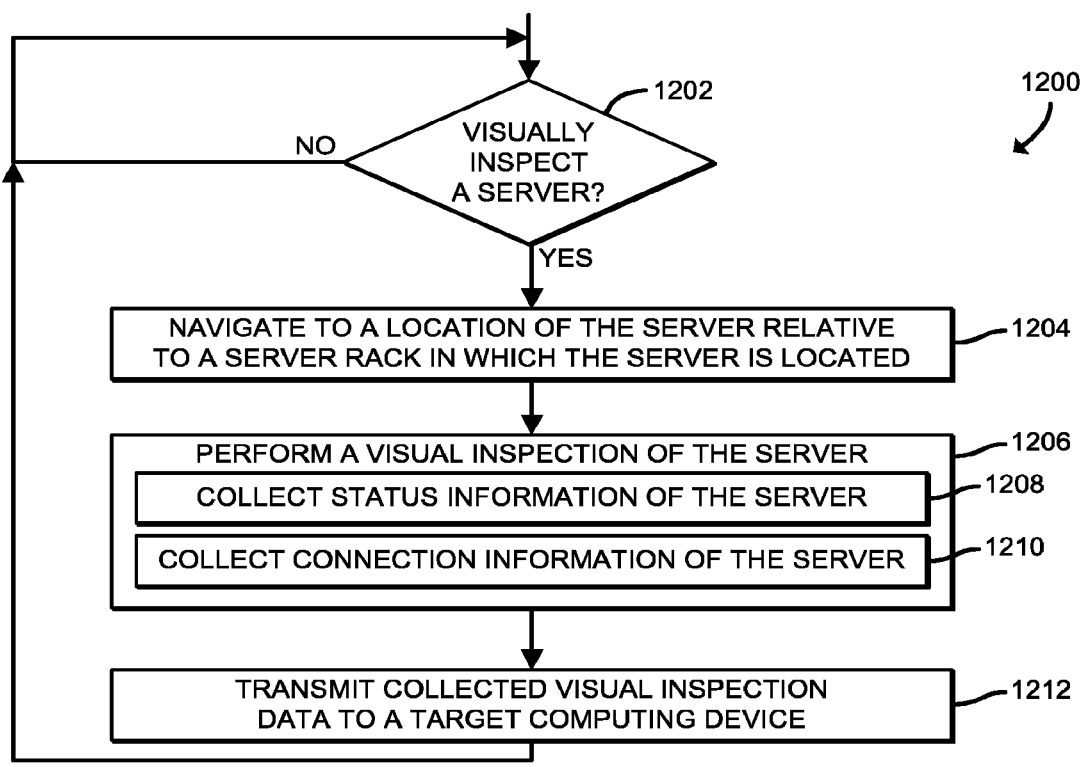
FIG. 12 is a simplified flow diagram of at least one embodiment of a method for performing a visual inspection of an asset of the data center of the system of FIG. 1 that may be executed by the UAV of FIGS. 3 and 5.

Referring now to FIG. 12, in use, the UAV 108 may execute a method 1200 for performing a visual inspection of a server (e.g., one of the servers 106). While the visual inspection of a server is described herein, it should be appreciated that the functions of the method 1200 may be applied to other types of assets of the data center 102. The method 1200 begins in block 1202, in which the UAV 108 determines whether to visually inspect a server. If so, the method 1200 advances to block 1204, in which the UAV 108 navigates to a location of the server relative to a server rack 104 in which the server is housed, such as may be determined by a previous mapping of the data center 102 and/or asset inventory scan (see, e.g., the method 800 of FIG. 8).

In block 1206, the UAV 108 performs a visual inspection of the server. During the visual inspection, the UAV 108 may collect any type of information related to the servers 106 that can be obtained based on imagery, video, or other visual inspection of the corresponding servers 106. For example, in block 1208, the UAV 108 collects status information (e.g., an image of the status indicators 214 of the server 106). The status information includes any information usable to determine a state of the server (e.g., on/off, normal/error, etc.) as of the time the visual inspection was performed. Additionally, in block 1210, the UAV 108 collects connection information of the server. The connection information may include, for example, a state of the data cable (e.g., connected/disconnected) as of the time the visual inspection was performed. In block 1212, the UAV transmits the visual inspection data collected during the visual inspection in block 1206 to a target computing device (e.g., the remote computing device 114) for analysis. It should be appreciated that, in some embodiments, at least a portion of the collected visual inspection data may be analyzed locally by the UAV 108.

Figure 13:
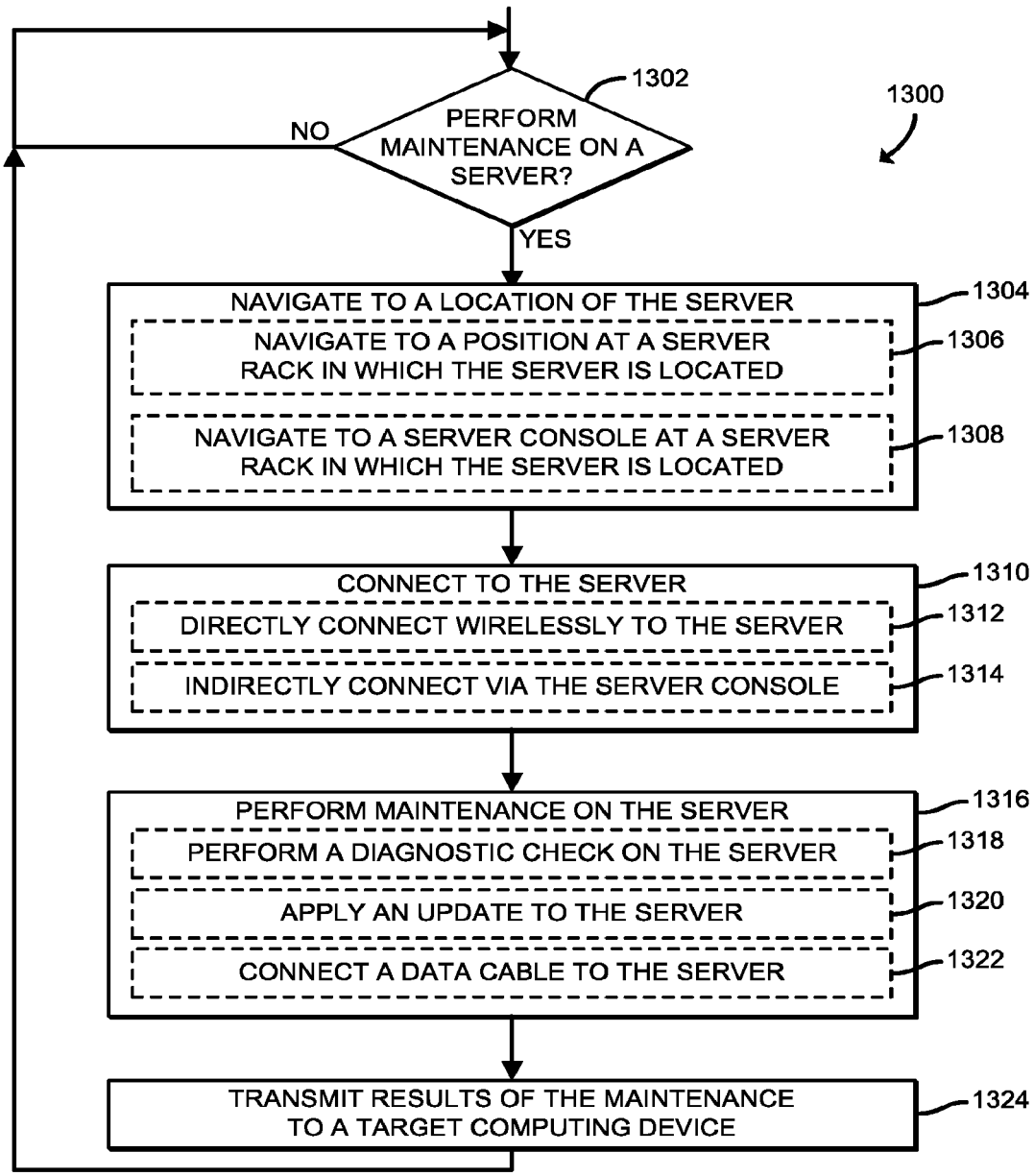
FIG. 13 is a simplified flow diagram of at least one embodiment of a method for performing maintenance on an asset of the data center of the system of FIG. 1 that may be executed by the UAV of FIGS. 3 and 5.

Referring now to FIG. 13, in use, the UAV 108 may execute a method 1300 for performing maintenance on a server (e.g., one of the servers 106). While the maintenance performance on a server is described herein, it should be appreciated that the functions of the method 1300 may be applied to other types of assets of the data center 102. The method 1300 begins in block 1302, in which the UAV 108 determines whether to perform maintenance on a server. If so, the method 1300 advances to block 1304, in which the UAV 108 navigates to a location of the server. To do so, in some embodiments, in block 1306, the UAV 108 navigates generally to a position relative to a server rack 104 (e.g., at a location of the server rack and at an elevation relative to the server rack 104) in which the server is housed, such as may be determined by a previous mapping of the data center 102 and/or asset inventory scan (see, e.g., the method 800 of FIG. 8). Alternatively, in some embodiments, in block 1308, the UAV 108 navigates to a server console of the server rack 104 (i.e., the server console (1) 120 of the server rack 116 and the server console (N) 128 of the server rack 124 (N)) in which the server is housed. It should be appreciated that, in such embodiments, the UAV 108 may land on a docking station (e.g., the docking station (1) 122 of the server rack 116, the docking station (N) 130 of the server rack 124 (N), etc.) in wireless communication proximity to the server console.

In block 1310, the UAV 108 connects to the server. In some embodiments, in block 1312, the UAV 108 may directly connect to the server via a wireless connection and secure communication channel. Alternatively, in some embodiments, in block 1314, the may indirectly connect to the server via a server console of the server rack 104 (i.e., the server console (1) 120 of the server rack 116, the server console (N) 128 of the server rack 124 (N), etc.) in which the server is housed.

In block 1316, the UAV 108 performs maintenance on the server. To perform maintenance on the server, in some embodiments, in block 1318, the UAV 108 may perform a diagnostic check on the server via the server console. Additionally or alternatively, to perform maintenance on the server in some embodiments, in block 1320, the UAV 108 may apply an update to the server. In some embodiments, in block 1322, to perform maintenance on the server the UAV 108 may connect a data cable (e.g., a data cable that became disconnected inadvertently or otherwise needs reconnected) to the server. In block 1324, the UAV 108 is configured to transmit results (e.g., success, failure, a return code, an error code, etc.) of the maintenance to a target computing device (e.g., the remote computing device 114) for analysis.

It should be appreciated that at least a portion of one or more of the methods 700 and 1000 may be embodied as various instructions stored on a computer-readable media, which may be executed by the processor 402, the communication circuitry 410, and/or other components of the remote computing device 114 to cause the remote computing device 114 to perform the methods 700 and 1000. The computer-readable media may be embodied as any type of media capable of being read by the remote computing device 114 including, but not limited to, the memory 406, the data storage device 408, a local memory of a NIC (not shown) of the communication circuitry 410, other memory or data storage devices of the remote computing device 114, portable media readable by a peripheral device of the remote computing device 114, and/or other media.

It should also be appreciated that at least a portion of one or more of the methods 800, 1100, 1200, and 1300 may be embodied as various instructions stored on a computer-readable media, which may be executed by the processor 302, the communication circuitry 310, and/or other components of the UAV 108 to cause the UAV 108 to perform the methods 800, 1100, 1200, and 1300. The computer-readable media may be embodied as any type of media capable of being read by the UAV 108 including, but not limited to, the memory 306, the data storage device 308, a local memory of a NIC (not shown) of the UAV 108, other memory or data storage devices of the UAV 108, portable media readable by a peripheral device of the UAV 108, and/or other media.

EXAMPLES

Illustrative examples of the technologies disclosed herein are provided below. An embodiment of the technologies may include any one or more, and any combination of, the examples described below.

Example 1 includes an unmanned aerial vehicle (UAV) for managing assets of a data center, the UAV comprising one or more processors; and one or more data storage devices having stored therein a plurality of instructions that, when executed by the one or more processors, cause the UAV to navigate throughout a data center; capture data center mapping information during the navigation, wherein the data center mapping information is usable to generate a three-dimensional (3D) model of the data center; and transmit the captured data center mapping information to a remote computing device wirelessly coupled to the UAV.

Example 2 includes the subject matter of Example 1, and wherein the plurality of instructions further cause the UAV to generate the 3D model of the data center; detect boundaries and obstructions within the data center based on the data center mapping information; and update the 3D model to include the detected boundaries and obstructions.

Example 3 includes the subject matter of any of Examples 1 and 2, and wherein the plurality of instructions further cause the UAV to identify assets of the data center based on the detected obstructions and known characteristics of the assets; and update the 3D model to include the identified assets of the data center.

Example 4 includes the subject matter of any of Examples 1-3, and wherein the plurality of instructions further cause the UAV to generate one or more flight paths throughout the data center based on the updated 3D model and the identified assets.

Example 5 includes the subject matter of any of Examples 1-4, and wherein to navigate throughout the data center comprises to navigate throughout the data center based on a predetermined flight path.

Example 6 includes the subject matter of any of Examples 1-5, and wherein to capture the data center mapping information comprises capturing a series of images usable to generate the 3D model of the data center, and wherein to navigate throughout the data center comprises to navigate in a flight pattern conducive to capturing the series of images from which the 3D model of the data center is capable of being generated.

Example 7 includes the subject matter of any of Examples 1-6, and wherein the plurality of instructions further cause the UAV to receive an indication from the remote computing device, wherein the indication indicates to map the data center.

Example 8 includes the subject matter of any of Examples 1-7, and wherein to navigate throughout the data center comprises to navigate throughout the data center in response to having received the indication from the remote computing device.

Example 9 includes the subject matter of any of Examples 1-8, and wherein the indication includes instruction on a flight path to be navigated throughout the data center.

Example 10 includes the subject matter of any of Examples 1-9, and wherein the plurality of instructions further cause the UAV to receive task instructions from the remote computing device, wherein the task instructions define a type of task to be performed by the UAV in the data center; and perform a task in the data center based on the received task instructions.

Example 11 includes the subject matter of any of Examples 1-10, and wherein the task instructions further include at least one of instruction on how to perform the type of task, a flight path to navigate to perform the task, one or more flight control settings to use during flight path navigation, one or more flight control settings to use during performance of the task, a location of a component on which the task is to be performed relative to the data center, a location of a component on which the task is to be performed relative to another asset of the data center, and data to be collected during performance of the task.

Example 12 includes the subject matter of any of Examples 1-11, and wherein the task instructions include data collection settings, wherein the data collection settings define what data is to be collected during performance of the task.

Example 13 includes the subject matter of any of Examples 1-12, and wherein the plurality of instructions further cause the UAV to collect the data based on one or more environment sensors, flight enabling sensors, and asset identification sensors.

Example 14 includes the subject matter of any of Examples 1-13, and wherein the environment sensors include one or more of an image sensor, an electro-optical sensor, a thermal sensor, a location sensor, a humidity sensor, an infra-red sensor, an air flow sensor, an acoustic sensor, an electromagnetic (EM) field sensor, a gas sensor, and a particulate matter sensors.

Example 15 includes the subject matter of any of Examples 1-14, and wherein the flight enabling sensors include one or more of an accelerometer, a gyroscope, and a magnetometer.

Example 16 includes the subject matter of any of Examples 1-15, and wherein the asset identification sensors include at least one of a radio-frequency identification (RFID) reader, a near field communication (NFC) reader, a barcode scanner, and a quick response (QR) code scanner.

Example 17 includes the subject matter of any of Examples 1-16, and wherein the type of task to be performed indicates to perform an identification of one or more of a plurality of server racks, and wherein the plurality of instructions further cause the UAV to navigate to a location of a server rack of the plurality of server racks to be identified based on the task instructions; detect, upon having navigated to the server rack, one or more identification characteristics of the server rack, wherein the one or more detected identification characteristics are usable to identify at least one of a type of the server rack and an orientation of the server rack; and transmit the one or more detected identification characteristics to the remote computing device.

Example 18 includes the subject matter of any of Examples 1-17, and wherein the type of task to be performed indicates to perform an inventory of a plurality of servers of the data center, wherein each of the plurality of servers is housed in one of a plurality of server racks of the data center, and wherein the plurality of instructions further cause the UAV to navigate to a location of the server relative to a server rack of the plurality of server racks to be inventoried based on the task instructions; scan a presently unscanned portion of the server rack; determine whether a server of the plurality of servers has been detected by the scan; collect, in response to a determination that the server has been detected by the scan, server inventory data of the detected server; and transmit the collected server inventory data to the remote computing device.

Example 19 includes the subject matter of any of Examples 1-18, and wherein to collect the server inventory data comprises to collect at least one of identifying information of the server, status information of the server, and position information of the server relative to a bay of the server rack in which the server is housed.

Example 20 includes the subject matter of any of Examples 1-19, and wherein the type of task to be performed indicates to perform maintenance on a server of a plurality of servers of the data center, wherein each of the plurality of servers is housed in one of a plurality of server racks of the data center, and wherein the plurality of instructions further cause the UAV to navigate to a location of the server relative to a server rack of the plurality of server racks in which the server is housed; connect to the server via a wireless communication channel; and perform maintenance on the server based on the task instructions.

Example 21 includes the subject matter of any of Examples 1-20, and wherein to navigate to the location of the server relative to the server rack comprises to navigate to a previously identified location of the server rack at a previously determined elevation from a floor of the data center corresponding to a bay of the server rack at which the server is housed.

Example 22 includes the subject matter of any of Examples 1-21, and wherein to navigate to the location of the server relative to the server rack comprises to navigate to a server console of the server rack in which the server is housed.

Example 23 includes the subject matter of any of Examples 1-22, and wherein to connect to the server comprises to connect to the server console.

Example 24 includes the subject matter of any of Examples 1-23, and wherein to perform maintenance on the server comprises to at least one of perform a diagnostic check on the server, apply an update to the server, and connect a data cable to the server.

Example 25 includes the subject matter of any of Examples 1-24, and wherein the plurality of instructions further cause the UAV to transmit a result of the performed maintenance to the remote computing device.

Example 26 includes an unmanned aerial vehicle (UAV) for managing assets of a data center, the UAV comprising a flight management circuit to manage navigation of the UAV throughout a data center; a data center mapping circuit to capture data center mapping information during the navigation, wherein the data center mapping information is usable to generate a three-dimensional (3D) model of the data center; and a communication management circuit to transmit the captured data center mapping information to a remote computing device wirelessly coupled to the UAV.

Example 27 includes the subject matter of Example 26, and wherein the data center mapping circuit is further to generate the 3D model of the data center; detect boundaries and obstructions within the data center based on the data center mapping information; and update the 3D model to include the detected boundaries and obstructions.

Example 28 includes the subject matter of any of Examples 26 and 27, and wherein the plurality of instructions further cause the UAV to identify assets of the data center based on the detected obstructions and known characteristics of the assets; and update the 3D model to include the identified assets of the data center.

Example 29 includes the subject matter of any of Examples 26-28, and wherein the plurality of instructions further cause the UAV to generate one or more flight paths throughout the data center based on the updated 3D model and the identified assets.

Example 30 includes the subject matter of any of Examples 26-29, and wherein to navigate throughout the data center comprises to navigate throughout the data center based on a predetermined flight path.

Example 31 includes the subject matter of any of Examples 26-30, and wherein to capture the data center mapping information comprises capturing a series of images usable to generate the 3D model of the data center, and wherein to navigate throughout the data center comprises to navigate in a flight pattern conducive to capturing the series of images from which the 3D model of the data center is capable of being generated.

Example 32 includes the subject matter of any of Examples 26-31, and wherein the plurality of instructions further cause the UAV to receive an indication from the remote computing device, wherein the indication indicates to map the data center.

Example 33 includes the subject matter of any of Examples 26-32, and wherein to navigate throughout the data center comprises to navigate throughout the data center in response to having received the indication from the remote computing device.

Example 34 includes the subject matter of any of Examples 26-33, and wherein the indication includes instruction on a flight path to be navigated throughout the data center.

Example 35 includes the subject matter of any of Examples 26-34, and wherein the plurality of instructions further cause the UAV to receive task instructions from the remote computing device, wherein the task instructions define a type of task to be performed by the UAV in the data center; and perform a task in the data center based on the received task instructions.

Example 36 includes the subject matter of any of Examples 26-35, and wherein the task instructions further include at least one of instruction on how to perform the type of task, a flight path to navigate to perform the task, one or more flight control settings to use during flight path navigation, one or more flight control settings to use during performance of the task, a location of a component on which the task is to be performed relative to the data center, a location of a component on which the task is to be performed relative to another asset of the data center, and data to be collected during performance of the task.

Example 37 includes the subject matter of any of Examples 26-36, and wherein the task instructions include data collection settings, wherein the data collection settings define what data is to be collected during performance of the task.

Example 38 includes the subject matter of any of Examples 26-37, and wherein the plurality of instructions further cause the UAV to collect the data based on one or more environment sensors, flight enabling sensors, and asset identification sensors.

Example 39 includes the subject matter of any of Examples 26-38, and wherein the environment sensors include one or more of an image sensor, an electro-optical sensor, a thermal sensor, a location sensor, a humidity sensor, an infra-red sensor, an air flow sensor, an acoustic sensor, an electromagnetic (EM) field sensor, a gas sensor, and a particulate matter sensors.

Example 40 includes the subject matter of any of Examples 26-39, and wherein the flight enabling sensors include one or more of an accelerometer, a gyroscope, and a magnetometer.

Example 41 includes the subject matter of any of Examples 26-40, and wherein the asset identification sensors include at least one of a radio-frequency identification (RFID) reader, a near field communication (NFC) reader, a barcode scanner, and a quick response (QR) code scanner.

Example 42 includes the subject matter of any of Examples 26-41, and wherein the type of task to be performed indicates to perform an identification of one or more of a plurality of server racks, and wherein the plurality of instructions further cause the UAV to navigate to a location of a server rack of the plurality of server racks to be identified based on the task instructions; detect, upon having navigated to the server rack, one or more identification characteristics of the server rack, wherein the one or more detected identification characteristics are usable to identify at least one of a type of the server rack and an orientation of the server rack; and transmit the one or more detected identification characteristics to the remote computing device.

Example 43 includes the subject matter of any of Examples 26-42, and wherein the type of task to be performed indicates to perform an inventory of a plurality of servers of the data center, wherein each of the plurality of servers is housed in one of a plurality of server racks of the data center, and wherein the plurality of instructions further cause the UAV to navigate to a location of the server relative to a server rack of the plurality of server racks to be inventoried based on the task instructions; scan a presently unscanned portion of the server rack; determine whether a server of the plurality of servers has been detected by the scan; collect, in response to a determination that the server has been detected by the scan, server inventory data of the detected server; and transmit the collected server inventory data to the remote computing device.

Example 44 includes the subject matter of any of Examples 26-43, and wherein to collect the server inventory data comprises to collect at least one of identifying information of the server, status information of the server, and position information of the server relative to a bay of the server rack in which the server is housed.

Example 45 includes the subject matter of any of Examples 26-44, and wherein the type of task to be performed indicates to perform maintenance on a server of a plurality of servers of the data center, wherein each of the plurality of servers is housed in one of a plurality of server racks of the data center, and wherein the plurality of instructions further cause the UAV to navigate to a location of the server relative to a server rack of the plurality of server racks in which the server is housed; connect to the server via a wireless communication channel; and perform maintenance on the server based on the task instructions.

Example 46 includes the subject matter of any of Examples 26-45, and wherein to navigate to the location of the server relative to the server rack comprises to navigate to a previously identified location of the server rack at a previously determined elevation from a floor of the data center corresponding to a bay of the server rack at which the server is housed.

Example 47 includes the subject matter of any of Examples 26-46, and wherein to navigate to the location of the server relative to the server rack comprises to navigate to a server console of the server rack in which the server is housed.

Example 48 includes the subject matter of any of Examples 26-47, and wherein to connect to the server comprises to connect to the server console.

Example 49 includes the subject matter of any of Examples 26-48, and wherein to perform maintenance on the server comprises to at least one of perform a diagnostic check on the server, apply an update to the server, and connect a data cable to the server.

Example 50 includes the subject matter of any of Examples 26-49, and wherein the plurality of instructions further cause the UAV to transmit a result of the performed maintenance to the remote computing device.

Example 51 including a method for managing assets of a data center, the method comprising navigating, by an unmanned aerial vehicle (UAV), throughout a data center; capturing, by the UAV, data center mapping information during the navigation, wherein the data center mapping information is usable to generate a three-dimensional (3D) model of the data center; and transmitting, by the UAV, the captured data center mapping information to a remote computing device wirelessly coupled to the UAV.

Example 52 includes the subject matter of Example 51, and further including generating, by the UAV, the 3D model of the data center; detecting, by the UAV, boundaries and obstructions within the data center based on the data center mapping information; and updating, by the UAV, the 3D model to include the detected boundaries and obstructions.

Example 53 includes the subject matter of any of Examples 51 and 52, and further including identifying, by the UAV, assets of the data center based on the detected obstructions and known characteristics of the assets; and updating, by the UAV, the 3D model to include the identified assets of the data center.

Example 54 includes the subject matter of any of Examples 51-53, and further including generating, by the UAV, one or more flight paths throughout the data center based on the updated 3D model and the identified assets.

Example 55 includes the subject matter of any of Examples 51-54, and wherein navigating throughout the data center comprises navigating throughout the data center based on a predetermined flight path.

Example 56 includes the subject matter of any of Examples 51-55, and wherein capturing the data center mapping information comprises capturing a series of images usable to generate the 3D model of the data center, and wherein navigating throughout the data center comprises navigating in a flight pattern conducive to capturing the series of images from which the 3D model of the data center is capable of being generated.

Example 57 includes the subject matter of any of Examples 51-56, and further including receiving, by the UAV, an indication from the remote computing device, wherein the indication indicates to map the data center.

Example 58 includes the subject matter of any of Examples 51-57, and wherein navigating throughout the data center comprises navigating throughout the data center in response to having received the indication from the remote computing device.

Example 59 includes the subject matter of any of Examples 51-58, and wherein the indication includes instruction on a flight path to be navigated throughout the data center.

Example 60 includes the subject matter of any of Examples 51-59, and further including receiving, by the UAV, task instructions from the remote computing device, wherein the task instructions define a type of task to be performed by the UAV in the data center; and performing, by the UAV, a task in the data center based on the received task instructions.

Example 61 includes the subject matter of any of Examples 51-60, and wherein the task instructions further include at least one of instruction on how to perform the type of task, a flight path to navigate to perform the task, one or more flight control settings to use during flight path navigation, one or more flight control settings to use during performance of the task, a location of a component on which the task is to be performed relative to the data center, a location of a component on which the task is to be performed relative to another asset of the data center, and data to be collected during performance of the task.

Example 62 includes the subject matter of any of Examples 51-61, and wherein the task instructions include data collection settings, wherein the data collection settings define what data is to be collected during performance of the task.

Example 63 includes the subject matter of any of Examples 51-62, and further including collecting, by the UAV, the data based on one or more environment sensors, flight enabling sensors, and asset identification sensors.

Example 64 includes the subject matter of any of Examples 51-63, and wherein the environment sensors include one or more of an image sensor, an electro-optical sensor, a thermal sensor, a location sensor, a humidity sensor, an infra-red sensor, an air flow sensor, an acoustic sensor, an electromagnetic (EM) field sensor, a gas sensor, and a particulate matter sensors.

Example 65 includes the subject matter of any of Examples 51-64, and wherein the flight enabling sensors include one or more of an accelerometer, a gyroscope, and a magnetometer.

Example 66 includes the subject matter of any of Examples 51-65, and wherein the asset identification sensors include at least one of a radio-frequency identification (RFID) reader, a near field communication (NFC) reader, a barcode scanner, and a quick response (QR) code scanner.

Example 67 includes the subject matter of any of Examples 51-66, and wherein the type of task to be performed indicates to perform an identification of one or more of a plurality of server racks, and further comprising navigating, by the UAV, to a location of a server rack of the plurality of server racks to be identified based on the task instructions; detecting, by the UAV and upon having navigated to the server rack, one or more identification characteristics of the server rack, wherein the one or more detected identification characteristics are usable to identify at least one of a type of the server rack and an orientation of the server rack; and transmitting, by the UAV, the one or more detected identification characteristics to the remote computing device.

Example 68 includes the subject matter of any of Examples 51-67, and wherein the type of task to be performed indicates to perform an inventory of a plurality of servers of the data center, wherein each of the plurality of servers is housed in one of a plurality of server racks of the data center, and further comprising navigating, by the UAV, to a location of the server relative to a server rack of the plurality of server racks to be inventoried based on the task instructions; scanning, by the UAV, a presently unscanned portion of the server rack; determining, by the UAV, whether a server of the plurality of servers has been detected by the scan; collecting, by the UAV and in response to a determination that the server has been detected by the scan, server inventory data of the detected server; and transmitting, by the UAV, the collected server inventory data to the remote computing device.

Example 69 includes the subject matter of any of Examples 51-68, and wherein collecting the server inventory data comprises collecting at least one of identifying information of the server, status information of the server, and position information of the server relative to a bay of the server rack in which the server is housed.

Example 70 includes the subject matter of any of Examples 51-69, and wherein the type of task to be performed indicates to perform maintenance on a server of a plurality of servers of the data center, wherein each of the plurality of servers is housed in one of a plurality of server racks of the data center, and further comprising navigating, by the UAV, to a location of the server relative to a server rack of the plurality of server racks in which the server is housed; connecting, by the UAV, to the server via a wireless communication channel; and performing, by the UAV, maintenance on the server based on the task instructions.

Example 71 includes the subject matter of any of Examples 51-70, and wherein navigating to the location of the server relative to the server rack comprises navigating to a previously identified location of the server rack at a previously determined elevation from a floor of the data center corresponding to a bay of the server rack at which the server is housed.

Example 72 includes the subject matter of any of Examples 51-71, and wherein navigating to the location of the server relative to the server rack comprises navigating to a server console of the server rack in which the server is housed.

Example 73 includes the subject matter of any of Examples 51-72, and wherein connecting to the server comprises connecting to the server console.

Example 74 includes the subject matter of any of Examples 51-73, and wherein performing maintenance on the server comprises performing at least one of a diagnostic check on the server, apply an update to the server, and connect a data cable to the server.

Example 75 includes the subject matter of any of Examples 51-74, and further including transmitting, by the UAV, a result of the performed maintenance to the remote computing device.

Example 76 includes an unmanned aerial vehicle (UAV) comprising a processor; and a memory having stored therein a plurality of instructions that when executed by the processor cause the UAV to perform the method of any of Examples 51-75.

Example 77 includes one or more machine readable storage media comprising a plurality of instructions stored thereon that in response to being executed result in an unmanned aerial vehicle performing the method of any of Examples 51-75.

Example 78 includes an unmanned aerial vehicle (UAV) for managing assets of a data center, the UAV comprising a flight management circuit to manage navigation of the UAV throughout a data center; means for capturing data center mapping information during the navigation, wherein the data center mapping information is usable to generate a three-dimensional (3D) model of the data center; and communication management circuitry transmitting, by the UAV, the captured data center mapping information to a remote computing device wirelessly coupled to the UAV.

Example 79 includes the subject matter of Example 78, and further including means for generating the 3D model of the data center; means for detecting boundaries and obstructions within the data center based on the data center mapping information; and means for updating the 3D model to include the detected boundaries and obstructions.

Example 80 includes the subject matter of any of Examples 78 and 79, and further including means for identifying assets of the data center based on the detected obstructions and known characteristics of the assets; and means for updating the 3D model to include the identified assets of the data center.

Example 81 includes the subject matter of any of Examples 78-80, and further including means for generating one or more flight paths throughout the data center based on the updated 3D model and the identified assets.

Example 82 includes the subject matter of any of Examples 78-81, and wherein to manage navigation throughout the data center comprises to manage navigation throughout the data center based on a predetermined flight path.

Example 83 includes the subject matter of any of Examples 78-82, and wherein the means for capturing the data center mapping information comprises means for capturing a series of images usable to generate the 3D model of the data center, and wherein to manage navigation throughout the data center comprises to manage navigation in a flight pattern conducive to capturing the series of images from which the 3D model of the data center is capable of being generated.

Example 84 includes the subject matter of any of Examples 78-83, and wherein the communication management circuitry is further to receive an indication from the remote computing device, wherein the indication indicates to map the data center.

Example 85 includes the subject matter of any of Examples 78-84, and wherein to manage navigation throughout the data center comprises to manage navigation throughout the data center in response to having received the indication from the remote computing device.

Example 86 includes the subject matter of any of Examples 78-85, and wherein the indication includes instruction on a flight path to be navigated throughout the data center.

Example 87 includes the subject matter of any of Examples 78-86, and wherein the communication management circuitry is further to receive task instructions from the remote computing device, wherein the task instructions define a type of task to be performed by the UAV in the data center; and further comprising means for performing a task in the data center based on the received task instructions.

Example 88 includes the subject matter of any of Examples 78-87, and wherein the task instructions further include at least one of instruction on how to perform the type of task, a flight path to navigate to perform the task, one or more flight control settings to use during flight path navigation, one or more flight control settings to use during performance of the task, a location of a component on which the task is to be performed relative to the data center, a location of a component on which the task is to be performed relative to another asset of the data center, and data to be collected during performance of the task.

Example 89 includes the subject matter of any of Examples 78-88, and wherein the task instructions include data collection settings, wherein the data collection settings define what data is to be collected during performance of the task.

Example 90 includes the subject matter of any of Examples 78-89, and further including an environment sensor management circuit to collect the data based on one or more environment sensors, flight enabling sensors, and asset identification sensors.

Example 91 includes the subject matter of any of Examples 78-90, and wherein the environment sensors include one or more of an image sensor, an electro-optical sensor, a thermal sensor, a location sensor, a humidity sensor, an infra-red sensor, an air flow sensor, an acoustic sensor, an electromagnetic (EM) field sensor, a gas sensor, and a particulate matter sensors.

Example 92 includes the subject matter of any of Examples 78-91, and wherein the flight enabling sensors include one or more of an accelerometer, a gyroscope, and a magnetometer.

Example 93 includes the subject matter of any of Examples 78-92, and wherein the asset identification sensors include at least one of a radio-frequency identification (RFID) reader, a near field communication (NFC) reader, a barcode scanner, and a quick response (QR) code scanner.

Example 94 includes the subject matter of any of Examples 78-93, and wherein the type of task to be performed indicates to perform an identification of one or more of a plurality of server racks, further comprising means for navigating to a location of a server rack of the plurality of server racks to be identified based on the task instructions; and means for detecting, upon having navigated to the server rack, one or more identification characteristics of the server rack, wherein the one or more detected identification characteristics are usable to identify at least one of a type of the server rack and an orientation of the server rack, and wherein the connection management circuit is further to transmit the one or more detected identification characteristics to the remote computing device.

Example 95 includes the subject matter of any of Examples 78-94, and wherein the type of task to be performed indicates to perform an inventory of a plurality of servers of the data center, wherein each of the plurality of servers is housed in one of a plurality of server racks of the data center, further comprising means for navigating to a location of the server relative to a server rack of the plurality of server racks to be inventoried based on the task instructions; means for scanning a presently unscanned portion of the server rack; means for determining whether a server of the plurality of servers has been detected by the scan; and means for collecting, in response to a determination that the server has been detected by the scan, server inventory data of the detected server, and wherein the connection management circuit is further to transmit the collected server inventory data to the remote computing device.

Example 96 includes the subject matter of any of Examples 78-95, and wherein the means for collecting the server inventory data comprises means for collecting at least one of identifying information of the server, status information of the server, and position information of the server relative to a bay of the server rack in which the server is housed.

Example 97 includes the subject matter of any of Examples 78-96, and wherein the type of task to be performed indicates to perform maintenance on a server of a plurality of servers of the data center, and wherein each of the plurality of servers is housed in one of a plurality of server racks of the data center, further comprising means for navigating to a location of the server relative to a server rack of the plurality of server racks in which the server is housed, wherein the connection management circuit is further to connect to the server via a wireless communication channel, and further comprising means for performing maintenance on the server based on the task instructions.

Example 98 includes the subject matter of any of Examples 78-97, and wherein the means for navigating to the location of the server relative to the server rack comprises means for navigating to a previously identified location of the server rack at a previously determined elevation from a floor of the data center corresponding to a bay of the server rack at which the server is housed.

Example 99 includes the subject matter of any of Examples 78-98, and wherein the means for navigating to the location of the server relative to the server rack comprises means for navigating to a server console of the server rack in which the server is housed.

Example 100 includes the subject matter of any of Examples 78-99, and wherein connecting to the server comprises connecting to the server console.

Example 101 includes the subject matter of any of Examples 78-100, and wherein performing maintenance on the server comprises performing at least one of a diagnostic check on the server, apply an update to the server, and connect a data cable to the server.

Example 102 includes the subject matter of any of Examples 78-101, and wherein the connection management circuit is further to transmit a result of the performed maintenance to the remote computing device.

Example 103 includes a remote computing device for managing assets of a data center via an unmanned aerial vehicle (UAV), the remote computing device comprising one or more processors; and one or more data storage devices having stored therein a plurality of instructions that, when executed by the one or more processors, cause the remote computing device to receive information of a present condition of the data center; analyze the received information to determine whether a task is to be performed in response to the present condition; identify, in response to a determination that the task is to be performed by a UAV in the data center, a type of task to be performed by the UAV based on the analysis of the received information; transmit a task request message to the UAV that includes the type of task identified to be performed by the UAV; and receive, from the UAV and in response to the transmission of the task request message, results of the performed task.

Example 104 includes the subject matter of Example 103, and wherein the present condition of the data center includes at least one of a present condition of an asset in the data center and a present condition of at least a portion of the data center.

Example 105 includes the subject matter of any of Examples 103 and 104, and wherein to analyze the received information comprises to (i) compare the present condition to a predetermined threshold to determine whether the present condition violates the predetermined threshold and (ii) determine whether a task is to be performed in response to a determination that a threshold violation has been determined.

Example 106 includes the subject matter of any of Examples 103-105, and wherein to determine whether the present condition violates the predetermined threshold comprises to determine whether the present condition is one of above a maximum threshold value, the present condition is below a minimum threshold value, the present condition is outside of a particular value range.

Example 107 includes the subject matter of any of Examples 103-106, and wherein the type of task comprises at least one of a data center map update task, an asset inventory task, a maintenance task, and a visual inspection task.

Example 108 includes the subject matter of any of Examples 103-107, and wherein the task request message includes instructions usable by the AUV to perform the task, wherein the instructions include at least one of flight path information, flight control information, location information of one or more assets of the data center on which to perform the task, and what information to collect.

Example 109 includes the subject matter of any of Examples 103-108, and wherein the plurality of instructions further cause the remote computing device to perform an action based on the results of the of the performed task from the UAV, wherein the action comprises to at least one of update asset inventory data stored local to the remote computing device, notify an administrator of the data center, and adjust a setting of an asset in the data center.

Example 110 includes the subject matter of any of Examples 103-109, and wherein to transmit the a task request message to the UAV comprises to transmit a visual inspection task request to the UAV, wherein the visual inspection task request is usable by the UAV to perform a visual inspection on at least one of the data center and one or more assets of the data center.

Example 111 includes the subject matter of any of Examples 103-110, and wherein to transmit the a task request message to the UAV comprises to transmit a data center mapping task request to the UAV, wherein the data center mapping task request is usable by the UAV to collect identifying characteristics of the data center, and wherein to receive the results of the performed task from the UAV comprises to receive the collected identifying characteristics of the data center from the UAV.

Example 112 includes the subject matter of any of Examples 103-111, and wherein the plurality of instructions further cause the remote computing device to generate a three-dimensional (3D) model of the data center based on the received collected identifying characteristics of the data center.

Example 113 includes the subject matter of any of Examples 103-112, and wherein to transmit the a task request message to the UAV comprises to transmit an asset inventory task request to the UAV, wherein the asset inventory task request is usable by the UAV to perform an inventory of one or more assets of the data center and collect inventory data of the one or more assets, and wherein to receive the results of the performed task from the UAV comprises to receive the collected inventory data of the one or more assets from the UAV.

Example 114 includes the subject matter of any of Examples 103-113, and wherein the plurality of instructions further cause the remote computing device to update an asset inventory log based on the received collected inventory data of the one or more assets from the UAV, wherein the asset inventory log includes location data of the one or more assets and status data of the one or more assets.

Example 115 includes the subject matter of any of Examples 103-114, and wherein the plurality of instructions further cause the remote computing device to update a 3D model of the data center based on the received collected inventory data of the one or more assets from the UAV.

Example 116 includes a remote computing device for managing assets of a data center via an unmanned aerial vehicle (UAV), the remote computing device comprising a communication management circuit to receive information of a present condition of the data center; a task management circuit to (i) analyze the received information to determine whether a task is to be performed in response to the present condition and (ii) identify, in response to a determination that the task is to be performed by a UAV in the data center, a type of task to be performed by the UAV based on the analysis of the received information; wherein the communication management circuit is further to (i) transmit a task request message to the UAV that includes the type of task identified to be performed by the UAV and (ii) receive, from the UAV and in response to the transmission of the task request message, results of the performed task.

Example 117 includes the subject matter of Example 116, and wherein the present condition of the data center includes at least one of a present condition of an asset in the data center and a present condition of at least a portion of the data center.

Example 118 includes the subject matter of any of Examples 116 and 117, and wherein to analyze the received information comprises to (i) compare the present condition to a predetermined threshold to determine whether the present condition violates the predetermined threshold and (ii) determine whether a task is to be performed in response to a determination that a threshold violation has been determined.

Example 119 includes the subject matter of any of Examples 116-118, and wherein to determine whether the present condition violates the predetermined threshold comprises to determine whether the present condition is one of above a maximum threshold value, the present condition is below a minimum threshold value, the present condition is outside of a particular value range.

Example 120 includes the subject matter of any of Examples 116-119, and wherein the type of task comprises at least one of a data center map update task, an asset inventory task, a maintenance task, and a visual inspection task.

Example 121 includes the subject matter of any of Examples 116-120, and wherein the task request message includes instructions usable by the AUV to perform the task, wherein the instructions include at least one of flight path information, flight control information, location information of one or more assets of the data center on which to perform the task, and what information to collect.

Example 122 includes the subject matter of any of Examples 116-121, and wherein the task management circuit is further to perform an action based on the results of the of the performed task from the UAV, wherein the action comprises to at least one of update asset inventory data stored local to the remote computing device, notify an administrator of the data center, and adjust a setting of an asset in the data center.

Example 123 includes the subject matter of any of Examples 116-122, and wherein to transmit the a task request message to the UAV comprises to transmit a visual inspection task request to the UAV, wherein the visual inspection task request is usable by the UAV to perform a visual inspection on at least one of the data center and one or more assets of the data center.

Example 124 includes the subject matter of any of Examples 116-123, and wherein to transmit the a task request message to the UAV comprises to transmit a data center mapping task request to the UAV, wherein the data center mapping task request is usable by the UAV to collect identifying characteristics of the data center, and wherein to receive the results of the performed task from the UAV comprises to receive the collected identifying characteristics of the data center from the UAV.

Example 125 includes the subject matter of any of Examples 116-124, and further including a data center map management circuit to cause the remote computing device to generate a three-dimensional (3D) model of the data center based on the received collected identifying characteristics of the data center.

Example 126 includes the subject matter of any of Examples 116-125, and wherein to transmit the a task request message to the UAV comprises to transmit an asset inventory task request to the UAV, wherein the asset inventory task request is usable by the UAV to perform an inventory of one or more assets of the data center and collect inventory data of the one or more assets, and wherein to receive the results of the performed task from the UAV comprises to receive the collected inventory data of the one or more assets from the UAV.

Example 127 includes the subject matter of any of Examples 116-126, and further including an asset inventory management circuit to cause the remote computing device to update an asset inventory log based on the received collected inventory data of the one or more assets from the UAV, wherein the asset inventory log includes location data of the one or more assets and status data of the one or more assets.

Example 128 includes the subject matter of any of Examples 116-127, and further including a data center map management circuit to update a 3D model of the data center based on the received collected inventory data of the one or more assets from the UAV.

Example 129 includes a method for managing assets of a data center via an unmanned aerial vehicle (UAV), the method comprising receiving, by a remote computing device, information of a present condition of the data center from the UAV; analyzing, by the remote computing device, the received information to determine whether a task is to be performed in response to the present condition; identifying, by the remote computing device and in response to a determination that the task is to be performed by a UAV in the data center, a type of task to be performed by the UAV based on the analysis of the received information; transmitting, by the remote computing device, a task request message to the UAV that includes the type of task identified to be performed by the UAV; and receiving, by the remote computing device and in response to transmission of the task request message, results of the performed task from the UAV.

Example 130 includes the subject matter of Example 129, and wherein receiving the information of the present condition of the data center comprises receiving at least one of a present condition of an asset in the data center and a present condition of at least a portion of the data center.

Example 131 includes the subject matter of any of Examples 129 and 130, and wherein analyzing the received information comprises (i) comparing the present condition to a predetermined threshold to determine whether the present condition violates the predetermined threshold and (ii) determining whether a task is to be performed in response to a determination that a threshold violation has been determined.

Example 132 includes the subject matter of any of Examples 129-131, and wherein comparing the present condition to the predetermined threshold to determine whether the present condition violates the predetermined threshold comprises determining whether the present condition is one of above a maximum threshold value, the present condition is below a minimum threshold value, or the present condition is outside of a particular value range.

Example 133 includes the subject matter of any of Examples 129-132, and wherein the type of task to be performed by the UAV based on the analysis of the received information comprises at least one of a data center map update task, an asset inventory task, a maintenance task, and a visual inspection task.

Example 134 includes the subject matter of any of Examples 129-133, and wherein transmitting the task request message includes transmitting instructions usable by the AUV to perform the task, wherein the instructions include at least one of flight path information, flight control information, location information of one or more assets of the data center on which to perform the task, and what information to collect.

Example 135 includes the subject matter of any of Examples 129-134, and further including performing, by the remote computing device, an action based on the results of the of the performed task from the UAV, wherein the action comprises to at least one of update asset inventory data stored local to the remote computing device, notify an administrator of the data center, and adjust a setting of an asset in the data center.

Example 136 includes the subject matter of any of Examples 129-135, and wherein transmitting the a task request message to the UAV comprises transmitting a visual inspection task request to the UAV, wherein the visual inspection task request is usable by the UAV to perform a visual inspection on at least one of the data center and one or more assets of the data center.

Example 137 includes the subject matter of any of Examples 129-136, and wherein transmitting the a task request message to the UAV comprises transmitting a data center mapping task request to the UAV, wherein the data center mapping task request is usable by the UAV to collect identifying characteristics of the data center, and wherein receiving the results of the performed task from the UAV comprises receiving the collected identifying characteristics of the data center from the UAV.

Example 138 includes the subject matter of any of Examples 129-137, and further including generating, by the remote computing device, a three-dimensional (3D) model of the data center based on the received collected identifying characteristics of the data center.

Example 139 includes the subject matter of any of Examples 129-138, and wherein transmitting the a task request message to the UAV comprises transmitting an asset inventory task request to the UAV, wherein the asset inventory task request is usable by the UAV to perform an inventory of one or more assets of the data center and collect inventory data of the one or more assets, and wherein receiving the results of the performed task from the UAV comprises receiving the collected inventory data of the one or more assets from the UAV.

Example 140 includes the subject matter of any of Examples 129-139, and further including updating, by the remote computing device, an asset inventory log based on the received collected inventory data of the one or more assets from the UAV, wherein the asset inventory log includes location data of the one or more assets and status data of the one or more assets.

Example 141 includes the subject matter of any of Examples 129-140, and further including updating, by the remote computing device, a 3D model of the data center based on the received collected inventory data of the one or more assets from the UAV.

Example 142 includes a remote computing device comprising a processor; and a memory having stored therein a plurality of instructions that when executed by the processor cause the remote computing device to perform the method of any of Examples 129-141.

Example 143 includes one or more machine readable storage media comprising a plurality of instructions stored thereon that in response to being executed result in a remote computing device performing the method of any of Examples 129-141.

Example 144 includes a remote computing device for managing assets of a data center via an unmanned aerial vehicle (UAV), the remote computing device comprising a communication management circuit to receive information of a present condition of the data center; means for analyzing the received information to determine whether a task is to be performed in response to the present condition; means for identifying, in response to a determination that the task is to be performed by a UAV in the data center, a type of task to be performed by the UAV based on the analysis of the received information; wherein the communication management circuit is further to (i) transmit a task request message to the UAV that includes the type of task identified to be performed by the UAV and (ii) receive, from the UAV and in response to the transmission of the task request message, results of the performed task.

Example 145 includes the subject matter of Example 144, and wherein to receive the information of the present condition of the data center comprises to receive at least one of a present condition of an asset in the data center and a present condition of at least a portion of the data center.

Example 146 includes the subject matter of any of Examples 144 and 145, and wherein the means for analyzing the received information comprises means for (i) comparing the present condition to a predetermined threshold to determine whether the present condition violates the predetermined threshold and (ii) determining whether a task is to be performed in response to a determination that a threshold violation has been determined.

Example 147 includes the subject matter of any of Examples 144-146, and wherein the means for comparing the present condition to the predetermined threshold to determine whether the present condition violates the predetermined threshold comprises means for determining whether the present condition is one of above a maximum threshold value, the present condition is below a minimum threshold value, or the present condition is outside of a particular value range.

Example 148 includes the subject matter of any of Examples 144-147, and wherein the type of task to be performed by the UAV based on the analysis of the received information comprises at least one of a data center map update task, an asset inventory task, a maintenance task, and a visual inspection task.

Example 149 includes the subject matter of any of Examples 144-148, and wherein to transmit the task request message includes to transmit instructions usable by the AUV to perform the task, wherein the instructions include at least one of flight path information, flight control information, location information of one or more assets of the data center on which to perform the task, and what information to collect.

Example 150 includes the subject matter of any of Examples 144-149, and further including means for performing an action based on the results of the of the performed task from the UAV, wherein the action comprises to at least one of update asset inventory data stored local to the remote computing device, notify an administrator of the data center, and adjust a setting of an asset in the data center.

Example 151 includes the subject matter of any of Examples 144-150, and wherein to transmit the a task request message to the UAV comprises to transmit a visual inspection task request to the UAV, wherein the visual inspection task request is usable by the UAV to perform a visual inspection on at least one of the data center and one or more assets of the data center.

Example 152 includes the subject matter of any of Examples 144-151, and wherein to transmit the a task request message to the UAV comprises to transmit a data center mapping task request to the UAV, wherein the data center mapping task request is usable by the UAV to collect identifying characteristics of the data center, and wherein to receive the results of the performed task from the UAV comprises to receive the collected identifying characteristics of the data center from the UAV.

Example 153 includes the subject matter of any of Examples 144-152, and further including means for generating a three-dimensional (3D) model of the data center based on the received collected identifying characteristics of the data center.

Example 154 includes the subject matter of any of Examples 144-153, and wherein to transmit the a task request message to the UAV comprises to transmit an asset inventory task request to the UAV, wherein the asset inventory task request is usable by the UAV to perform an inventory of one or more assets of the data center and collect inventory data of the one or more assets, and wherein to receive the results of the performed task from the UAV comprises to receive the collected inventory data of the one or more assets from the UAV.

Example 155 includes the subject matter of any of Examples 144-154, and further including means for updating an asset inventory log based on the received collected inventory data of the one or more assets from the UAV, wherein the asset inventory log includes location data of the one or more assets and status data of the one or more assets.

Example 156 includes the subject matter of any of Examples 144-155, and further including means for updating a 3D model of the data center based on the received collected inventory data of the one or more assets from the UAV.

The invention claimed is:

1. An unmanned aerial vehicle (UAV) for managing assets of a data center, the UAV comprising:
   one or more processors; and
   one or more data storage devices having stored therein a plurality of instructions that, when executed by the one or more processors, cause the UAV to:
   navigate throughout a data center;
   identify assets of the data center comprising one or more of server racks or servers based on known characteristics of the assets;
   capture data center mapping information during the navigation, wherein the data center mapping information is usable to generate a three-dimensional (3D) model of the data center including the identified assets of the data center; and
   transmit the captured data center mapping information to a remote computing device wirelessly coupled to the UAV.

2. The UAV of claim 1, wherein the plurality of instructions further cause the UAV to:
   generate the 3D model of the data center;
   detect boundaries and obstructions within the data center based on the data center mapping information; and
   update the 3D model to include the detected boundaries and obstructions.

3. The UAV of claim 2, wherein the plurality of instructions further cause the UAV to:
   identify assets of the data center based on the detected obstructions; and
   update the 3D model to include the identified assets of the data center.

4. The UAV of claim 3, wherein the plurality of instructions further cause the UAV to generate one or more flight paths throughout the data center based on the updated 3D model and the identified assets, wherein to navigate throughout the data center comprises to navigate throughout the data center based on a predetermined flight path.

5. The UAV of claim 1, wherein to capture the data center mapping information comprises capturing a series of images usable to generate the 3D model of the data center, and wherein to navigate throughout the data center comprises to navigate in a flight pattern conducive to capturing the series of images from which the 3D model of the data center is capable of being generated.

6. The UAV of claim 1, wherein the plurality of instructions further cause the UAV to receive an indication from the remote computing device, wherein the indication indicates to map the data center and includes instruction on a flight path to be navigated throughout the data center, and wherein to navigate throughout the data center comprises to navigate throughout the data center in response to having received the indication from the remote computing device.

7. The UAV of claim 1, wherein the plurality of instructions further cause the UAV to:

receive task instructions from the remote computing device, wherein the task instructions define a type of task to be performed by the UAV in the data center; and perform a task in the data center based on the received task instructions, wherein the task instructions include data collection settings that define which types of data are to be collected during performance of the task.

8. The UAV of claim 7, wherein the type of task to be performed indicates to perform an identification of one or more of a plurality of server racks, and wherein the plurality of instructions further cause the UAV to:

navigate to a location of a server rack of the plurality of server racks to be identified based on the task instructions;

detect, upon having navigated to the server rack, one or more identification characteristics of the server rack, wherein the one or more detected identification characteristics are usable to identify at least one of a type of the server rack and an orientation of the server rack; and transmit the one or more detected identification characteristics to the remote computing device.

9. The UAV of claim 7, wherein the type of task to be performed indicates to perform an inventory of a plurality of servers of the data center, wherein each of the plurality of servers is housed in one of a plurality of server racks of the data center, and wherein the plurality of instructions further cause the UAV to:

navigate to a location of the server relative to a server rack of the plurality of server racks to be inventoried based on the task instructions;

scan a presently unscanned portion of the server rack;

determine whether a server of the plurality of servers has been detected by the scan;

collect, in response to a determination that the server has been detected by the scan, server inventory data of the detected server; and transmit the collected server inventory data to the remote computing device.

10. The UAV of claim 9, wherein to collect the server inventory data comprises to collect at least one of identifying information of the server, status information of the server, and position information of the server relative to a bay of the server rack in which the server is housed.

11. The UAV of claim 7, wherein the type of task to be performed indicates to perform maintenance on a server of a plurality of servers of the data center, wherein each of the plurality of servers is housed in one of a plurality of server racks of the data center, and wherein the plurality of instructions further cause the UAV to:

navigate to a location of the server relative to a server rack of the plurality of server racks in which the server is housed;

connect to the server via a wireless communication channel; and perform maintenance on the server based on the task instructions.

12. One or more non-transitory, computer-readable storage media comprising a plurality of instructions stored thereon that in response to being executed cause an unmanned aerial vehicle (UAV) to:

navigate throughout a data center;

identify assets of the data center comprising one or more of server racks and servers based on known characteristics of the assets;

capture data center mapping information during the navigation, wherein the data center mapping information is usable to generate a three-dimensional (3D) model of the data center including the identified assets of the data center; and transmit the captured data center mapping information to a remote computing device wirelessly coupled to the UAV.

13. The one or more non-transitory, computer-readable storage media of claim 12, wherein the plurality of instructions further cause the UAV to:

generate the 3D model of the data center;

detect boundaries and obstructions within the data center based on the data center mapping information; and update the 3D model to include the detected boundaries and obstructions.

14. The one or more non-transitory, computer-readable storage media of claim 13, wherein the plurality of instructions further cause the UAV to:

identify assets of the data center based on the detected obstructions; and update the 3D model to include the identified assets of the data center.

15. The one or more non-transitory, computer-readable storage media of claim 14, wherein the plurality of instructions further cause the UAV to generate one or more flight paths throughout the data center based on the updated 3D model and the identified assets, wherein to navigate throughout the data center comprises to navigate throughout the data center based on a predetermined flight path.

16. The one or more non-transitory, computer-readable storage media of claim 12, wherein to capture the data center mapping information comprises to capture a series of images usable to generate the 3D model of the data center, and wherein to navigate throughout the data center comprises to navigate in a flight pattern conducive to capturing the series of images from which the 3D model of the data center is capable of being generated.

17. The one or more non-transitory, computer-readable storage media of claim 12, wherein the plurality of instructions further cause the UAV to receive an indication from the remote computing device, wherein the indication indicates to map the data center and includes instruction on a flight path to be navigated throughout the data center, and wherein to navigate throughout the data center comprises to navigate throughout the data center in response to having received the indication from the remote computing device.

18. The one or more non-transitory, computer-readable storage media of claim 12, wherein the plurality of instructions further cause the UAV to:

receive task instructions from the remote computing device, wherein the task instructions define a type of task to be performed by the UAV in the data center; and perform a task in the data center based on the received task instructions, wherein the task instructions include data collection settings that define which types of data are to be collected during performance of the task.

19. The one or more non-transitory, computer-readable storage media of claim 18, wherein the type of task to be performed indicates to perform an identification of one or more of a plurality of server racks, and wherein the plurality of instructions further cause the UAV to:

navigate to a location of a server rack of the plurality of server racks to be identified based on the task instructions;

detect, upon having navigated to the server rack, one or more identification characteristics of the server rack, wherein the one or more detected identification characteristics are usable to identify at least one of a type of the server rack and an orientation of the server rack; and transmit the one or more detected identification characteristics to the remote computing device.

20. The one or more non-transitory, computer-readable storage media of claim 18, wherein the type of task to be performed indicates to perform an inventory of a plurality of servers of the data center, wherein each of the plurality of servers is housed in one of a plurality of server racks of the data center, and wherein the plurality of instructions further cause the UAV to:

navigate to a location of the server relative to a server rack of the plurality of server racks to be inventoried based on the task instructions;

scan a presently unscanned portion of the server rack;

determine whether a server of the plurality of servers has been detected by the scan;

collect, in response to a determination that the server has been detected by the scan, server inventory data of the detected server; and transmit the collected server inventory data to the remote computing device.

21. An unmanned aerial vehicle (UAV) for managing assets of a data center, the UAV comprising:

one or more processors; and one or more data storage devices having stored therein a plurality of instructions that, when executed by the one or more processors, cause the UAV to:

navigate to a location of a server in a data center;

connect to the server via a wireless communication channel;

perform maintenance on the server; and transmit results of the maintenance on the server to a remote computing device wirelessly coupled to the UAV.

22. The UAV of claim 21, wherein to perform maintenance on the server comprises one or more of (i) to perform a diagnostic check on the server; (ii) to apply an update to the server; or (iii) to connect a data cable to the server.

23. The UAV of claim 21, wherein to navigate to the location of the server in the data center comprises (i) to navigate to a position at which a server rack in which the server is located; or (ii) to navigate to a server console at which a server rack in which the server is located.

* * * * *